US012666566B2

(12) United States Patent
Nagimov et al.

(10) Patent No.: US 12,666,566 B2
(45) Date of Patent: *Jun. 23, 2026

(54) SYSTEMS AND METHODS FOR MICROFLUIDIC THERMAL MANAGEMENT

(71) Applicant: Microsoft Technology Licensing, LLC, Redmond, WA (US)

(72) Inventors: Ruslan Nagimov, Redmond, WA (US); Bharath Ramakrishnan, Bellevue, WA (US); Husam Atallah Alissa, Seattle, WA (US); Vaidehi Oruganti, Kirkland, WA (US); Christian L. Belady, Mercer Island, WA (US)

(73) Assignee: Microsoft Technology Licesning, LLC, Redmond, WA (US)

( * ) Notice: Subject to any disclaimer, the term of this patent is extended or adjusted under 35 U.S.C. 154(b) by 645 days.

This patent is subject to a terminal disclaimer.

(21) Appl. No.: 18/083,998

(22) Filed: Dec. 19, 2022

(65) Prior Publication Data

US 2024/0206116 A1 Jun. 20, 2024

(51) Int. Cl.
*H05K 7/20* (2006.01)
*F16K 99/00* (2006.01)
*G05D 23/19* (2006.01)

(52) U.S. Cl.
CPC ..... *H05K 7/20272* (2013.01); *F16K 99/0048* (2013.01); *G05D 23/1919* (2013.01);
(Continued)

(58) Field of Classification Search
CPC ........... H05K 7/20272; H05K 7/20281; H05K 7/20509; F16K 99/0048; F16K 2099/0098; G05D 23/1919; G06F 2200/201; G06F 1/20; G06F 1/206; B81B 7/0093; F04B 43/046; H01L 23/473
See application file for complete search history.

(56) References Cited

U.S. PATENT DOCUMENTS 7,694,723 B2 * 4/2010 Ma .......................... H01L 23/34
165/80.4
9,035,452 B2 5/2015 Weaver
(Continued)

FOREIGN PATENT DOCUMENTS

CN 110809359 A 2/2020

OTHER PUBLICATIONS

U.S. Appl. No. 18/083,966, filed Dec. 19, 2022.
(Continued)

*Primary Examiner* — Stephen S Sul
(74) *Attorney, Agent, or Firm* — Ray Quinney & Nebeker P.C.; John O. Carpenter

(57) ABSTRACT
A thermal management device includes a microfluidic volume having a first peripheral side and a second peripheral side and including at least one thermal element, a first port to the microfluidic volume, a second port from the microfluidic volume, an inlet valve at the first port to the microfluidic volume, an outlet valve at the second port, and a valve piezoelectric element in mechanical communication with a portion of at least one of the inlet valve and the outlet valve to move at least the portion of the at least one of the inlet valve and the outlet valve and selectively allow fluid flow through the microfluidic volume.

20 Claims, 15 Drawing Sheets

(52) U.S. Cl.
   CPC ..... *H05K 7/20281* (2013.01); *H05K 7/20509*
   (2013.01); *F16K 2099/0098* (2013.01)

(56) References Cited

U.S. PATENT DOCUMENTS

| | | | | |
|---|---|---|---|---|
| 9,233,838 | B2 | 1/2016 | Arik et al. | |
| 2004/0037043 | A1* | 2/2004 | Ku | H01L 23/4334 |
| | | | | 257/E23.092 |
| 2006/0050483 | A1* | 3/2006 | Wilson | H01L 23/473 |
| | | | | 361/689 |
| 2008/0314565 | A1* | 12/2008 | Martin | H01L 23/427 |
| | | | | 165/80.4 |
| 2009/0129952 | A1 | 5/2009 | Patrascu | |
| 2013/0000758 | A1* | 1/2013 | Hoen | F04B 43/046 |
| | | | | 137/565.01 |
| 2013/0150790 | A1* | 6/2013 | Palmieri | A61M 5/142 |
| | | | | 417/322 |
| 2015/0070836 | A1 | 3/2015 | Yairi | |
| 2020/0053905 | A1* | 2/2020 | Ganti | F04D 33/00 |
| 2022/0087064 | A1 | 3/2022 | Ganti | |
| 2023/0003786 | A1* | 1/2023 | Tustaniwskyj | H01L 23/46 |
| 2024/0198330 | A1* | 6/2024 | Nagimov | B01L 3/502715 |
| 2024/0335833 | A1* | 10/2024 | Kibler | F04B 43/043 |
| 2025/0220849 | A1* | 7/2025 | Bosch Coch | H05K 7/20263 |

OTHER PUBLICATIONS

International Preliminary Report on Patentability (Chapter I) received for PCT Application No. PCT/US2023/035751, mailed on Jul. 3, 2025, 9 pages.
International Preliminary Report on Patentability received for PCT Application No. PCT/US2023/036322, mailed on Jul. 3, 2025, 09 pages.
"Piezoelectric Micro Pumps", Retrieved From: https://web.archive.org/web/20200807183422/https://www.takasago-fluidics.com/pages/piezoelectric-micro-pumps, Aug. 7, 2020, 6 Pages.
Sarvey, et al., "Monolithic Integration of a Micropin-Fin Heat Sink in a 28-nm FPGA", In Proceedings of IEEE Transactions on Components, Packaging and Manufacturing Technology, vol. 7, Issue 10, Oct. 2017, pp. 1617-1624.
Wang, et al., "3D integrated circuit cooling with microfluidics", In Journal of Micromachines, vol. 9, Issue 6, Jun. 7, 2018, 14 Pages.
Wang, et al., "Cilia Metasurfaces for Electronically Programmable Microfluidic Manipulation", In Journal of Nature, vol. 605, Issue 7911, May 25, 2022, pp. 681-686.
Zhang, et al., "Independent interlayer microfluidic cooling for heterogeneous 3D IC applications", In Journal of Electronics Letters, vol. 49, Issue 6, Mar. 14, 2013, 2 Pages.
International Search Report and Written Opinion received for PCT Application No. PCT/US2023/035751, Mar. 12, 2024, 14 pages.
International Search Report and Written Opinion received for PCT Application No. PCT/US2023/036322, Feb. 19, 2024, 14 pages.
Non-Final Office Action mailed on Aug. 27, 2025, in U.S. Appl. No. 18/083,966, 09 pages.

* cited by examiner

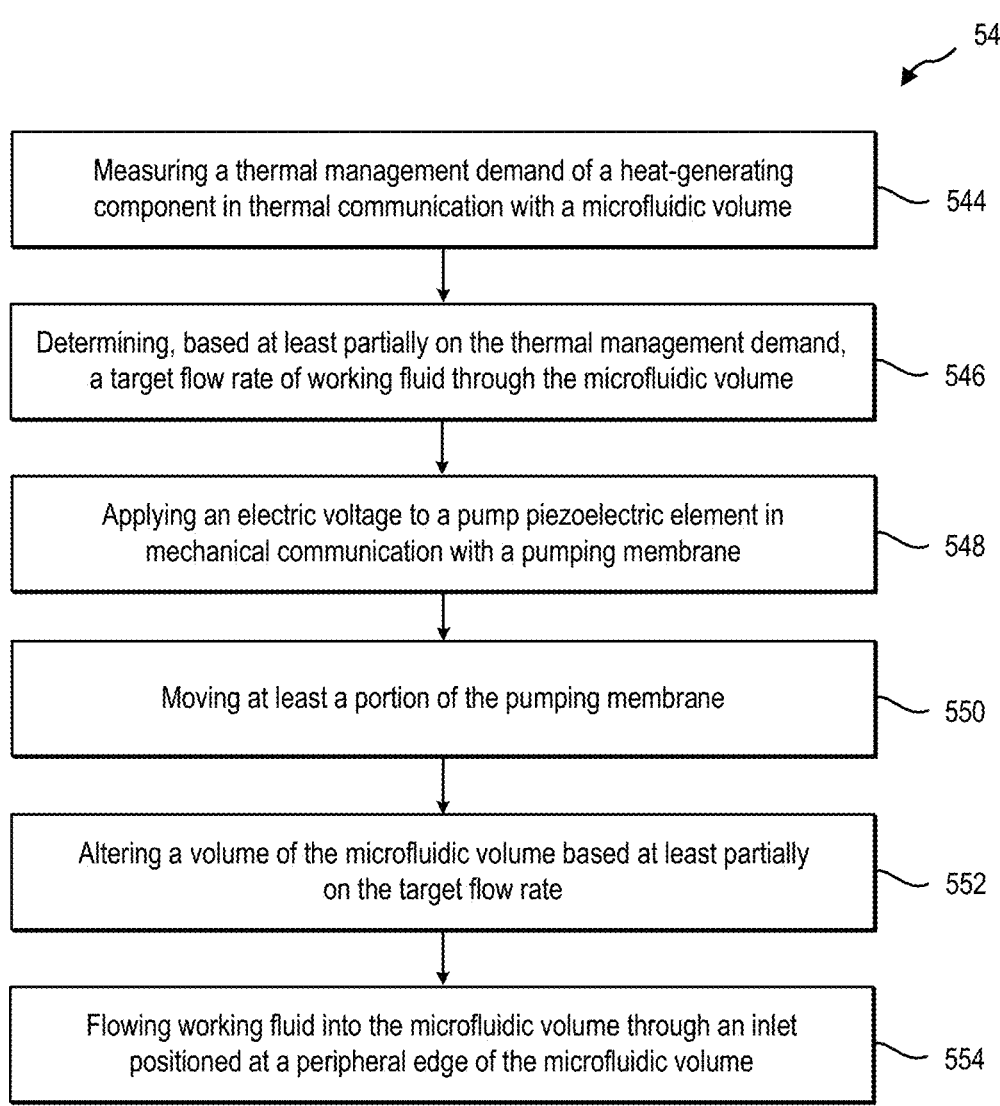

542

Measuring a thermal management demand of a heat-generating component in thermal communication with a microfluidic volume — 544

Determining, based at least partially on the thermal management demand, a target flow rate of working fluid through the microfluidic volume — 546

Applying an electric voltage to a pump piezoelectric element in mechanical communication with a pumping membrane — 548

Moving at least a portion of the pumping membrane — 550

Altering a volume of the microfluidic volume based at least partially on the target flow rate — 552

Flowing working fluid into the microfluidic volume through an inlet positioned at a peripheral edge of the microfluidic volume — 554

SYSTEMS AND METHODS FOR MICROFLUIDIC THERMAL MANAGEMENT

BACKGROUND

Background and Relevant Art

Direct thermal management of a heat-generating component can allow for more efficient removal of heat by limiting or eliminating thermal interfaces between the heat-generating component and the thermal management device. Flowing a working fluid through a microfluidic volume of a heat-generating component can provide direct cooling to a processor through on-die removal of heat.

BRIEF SUMMARY

In some embodiments, In some embodiments, a thermal management device includes a microfluidic volume having a first peripheral side and a second peripheral side and including at least one thermal element, a first port to the microfluidic volume, a second port from the microfluidic volume, an inlet valve at the first port to the microfluidic volume, an outlet valve at the second port, and a valve piezoelectric element in mechanical communication with a portion of at least one of the inlet valve and the outlet valve to move at least the portion of the at least one of the inlet valve and the outlet valve and selectively allow fluid flow through the microfluidic volume.

In some embodiments, a method of thermal management includes measuring a thermal management demand of a heat-generating component in thermal communication with a microfluidic volume; determining, based at least partially on the thermal management demand, a flow path of working fluid through the microfluidic volume; applying an electric voltage or current to a valve piezoelectric element in mechanical communication with a portion of an inlet valve; moving at least a portion of the inlet valve; applying an electric voltage or current to a valve piezoelectric element in mechanical communication with a portion of an outlet valve; moving at least a portion of the outlet valve; and flowing working fluid in the flow path through the microfluidic volume from the inlet valve toward the outlet valve.

In some embodiments, a thermal management device includes a microfluidic volume having a first peripheral side and a second peripheral side and including at least one thermal element, a first port to the microfluidic volume, a second port the microfluidic volume, a first bi-directional manifold in fluid communication with the first port, and a second bi-directional manifold in fluid communication with the second port.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the disclosure may be realized and obtained by means of the instruments and combinations particularly pointed out in the appended claims. Features of the present disclosure will become more fully apparent from the following description and appended claims or may be learned by the practice of the disclosure as set forth hereinafter.

BRIEF DESCRIPTION OF THE DRAWINGS

In order to describe the manner in which the above-recited and other features of the disclosure can be obtained, a more particular description will be rendered by reference to specific embodiments thereof which are illustrated in the appended drawings. For better understanding, the like elements have been designated by like reference numbers throughout the various accompanying figures. While some of the drawings may be schematic or exaggerated representations of concepts, at least some of the drawings may be drawn to scale. Understanding that the drawings depict some example embodiments, the embodiments will be described and explained with additional specificity and detail through the use of the accompanying drawings in which:

FIG. 1-2 is side view of the processor of FIG. 1-1 with a heat sink connected thereto;

FIG. 2-1 through 2-5 are side cross-sectional views of a microfluidic thermal management device with a piezoelectric pumping membrane, according to at least some embodiments of the present disclosure;

FIG. 3-1 through 3-5 are side cross-sectional views of a microfluidic thermal management device with a piezoelectric element coupled to a pumping membrane, according to at least some embodiments of the present disclosure;

FIG. 4-1 through 4-3 are side cross-sectional views of a microfluidic thermal management device with piezoelectric valves, according to at least some embodiments of the present disclosure;

FIGS. 5-1 and 5-2 are flowcharts illustrating methods of thermal management, according to at least some embodiments of the present disclosure;

FIG. 6-1 through 6-4 are top cross-sectional views of a thermal management device selectively actuating valves, according to at least some embodiments of the present disclosure;

DETAILED DESCRIPTION

Figure 1:
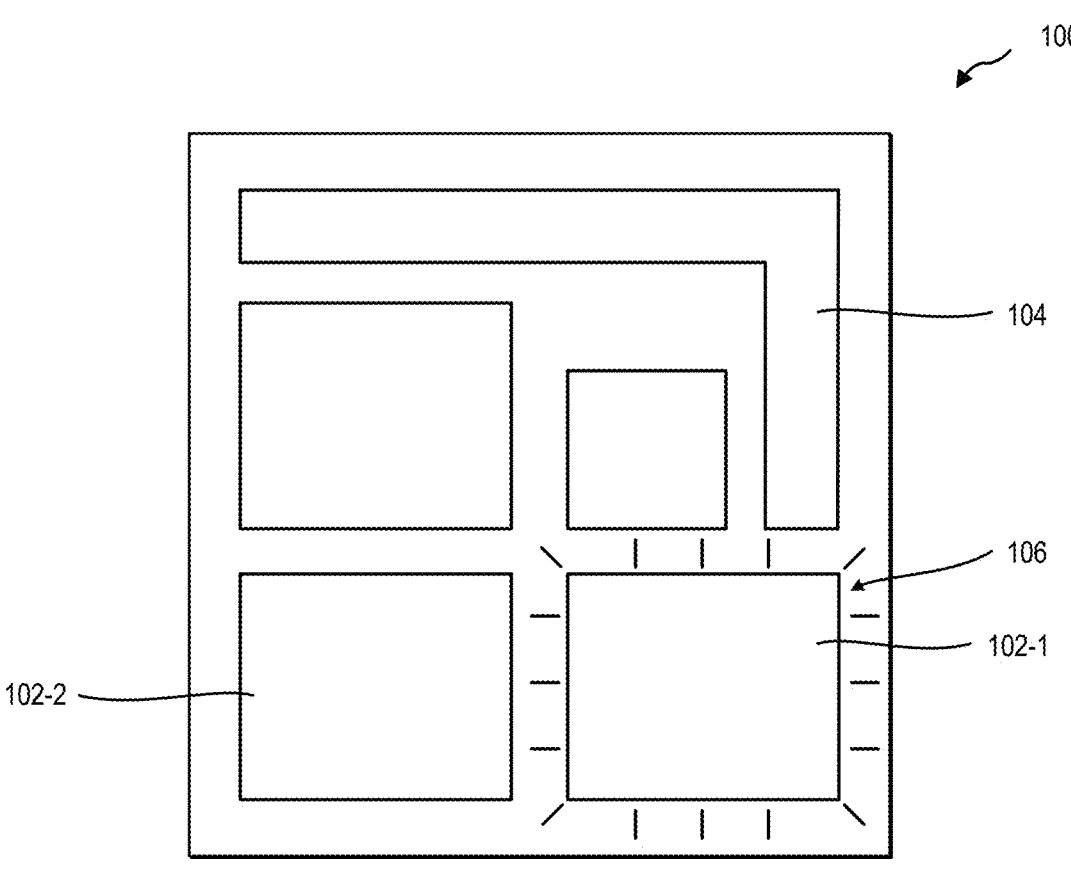
FIG. 1-1 is a top view of a processor.

Conventional thermal management for processors, such as central processing units (CPUs) and graphical processing units (GPUs), memory, application specific integrated circuits (ASICs), system-on-chips (SOCs), system-in-packages (SIPs), and other heat-generating components in an electronic device seeks to conduct heat from the hottest portion (i.e., a hot spot) of the heat-generating component to colder regions. For example, a heat spreader may conduct heat from the hot spot(s) of a processor across a surface area of the processor and/or a thermal interface to a heat sink. In some examples, the thermal management moves heat from the hot spot(s) to an ambient air or to a liquid-cooling system.

A heat spreader may compensate for hot spots through a relatively high thermal capacity. Rapid changes in the temperature or the total dissipated power (TDP) in some regions of the heat-generating component are buffered by the high thermal capacity of the heat spreader. The heat spreader may then transfer the heat to the heat sink, which exhausts the waste heat. However, conventional heat spreaders and heat sinks require a relatively large volume and/or mass to effectively spread and exhaust heat. Microfluidic cooling allows a working fluid to be applied directly to the die or other surface of the heat-generating component. The lower mass and thermal capacity of a working fluid (liquid or gas) relative to a heat spreader can allow a hot spot to rise in temperature more than a conventional heat spreader.

In some embodiments according to the present disclosure, a working fluid is flowed through a microfluidic volume using selectively actuated valves and/or pumping membranes in the microfluidic volume to flow cool working fluid across hot spots and effectively manage the heat generated by the heat-generating components.

A thermal management device according to the present disclosure allows for working fluid to flow through a microfluidic volume in response to thermal management demands of the heat-generating component cooled by the thermal management device. While thermal management devices will be described herein in relation to processors, it should be understood that a microfluidic thermal management device according to various embodiments of the present disclosure may be equally applicable to other heat-generating components in an electronic device, and any description of a processor or elements of a processor should not be understood to limit such applications.

In some embodiments, a thermal management device includes a pumping membrane proximate to and/or in contact with the microfluidic volume. The pumping membrane may be or include a piezoelectric element that, when an electrical voltage or current is applied thereto, expands or contracts in at least one dimension and moves the pumping membrane. For example, the pumping membrane may include a piezoelectric material such that the pumping membrane moves and changes a volume of the microfluidic volume. In some examples, the volume increases when an electrical voltage or current is applied to the piezoelectric element. In some examples, the volume decreases when an electrical voltage or current is applied to the piezoelectric element. In at least one example, the pumping membrane is between a first microfluidic volume and a second microfluidic volume opposite the first microfluidic volume, such that movement of the pumping membrane causes a volume of the first microfluidic volume to increase while a volume of the second microfluidic volume decreases and vice versa.

In some embodiments, a thermal management device includes one or more valves positioned at ports to the microfluidic volume. The valves are selectively actuated to allow fluid communication to the microfluidic volume and flow of a working fluid through the microfluidic volume. In some embodiments, the valves include a flexible valve membrane that is movable between a closed position (e.g., seated against a valve seat) and an open position (e.g., at least partially moved away from the valve seat) to allow fluid flow therethrough. In some embodiments, the valve includes a rigid element that is movable between a closed position and an open position. By selectively allowing fluid communication through the ports, the valve(s) can adapt the flow of the working fluid, in flow rate, direction, or path, based at least partially on thermal management demands of the heat-generating component or available cooling capacity of a working fluid.

In at least some embodiments, a valve is actuatable by a piezoelectric element, such as a piezoelectric valve membrane or piezoelectric element in mechanical communication with a valve membrane. During application of an electric voltage or current to the piezoelectric element of the valve, the valve membrane may move between the closed position and open position or vice versa. In other examples, a piezoelectric element may move a rigid element of the valve between the closed position and open position or vice versa.

In some embodiments, a thermal management device according to the present disclosure is in electrical communication with a controller and/or power source that alters a flow of working fluid through the microfluidic volume at least partially based on the thermal management demands of the heat-generating component. In some examples, the thermal management demands are based at least partially on temperature measurements of one or more locations or portions of the heat-generating component, which may allow for additional cooling to those locations or portions in response to increases in temperature. In some examples, the thermal management demands are based at least partially on power draw measurements of one or more locations or portions of the heat-generating component, which may allow for additional cooling to be provided to those locations or portions in anticipation of temperature increases associated with power draw increases. In some examples, the thermal management demands are based at least partially on workload measurements or reports of one or more portions of the heat-generating component, which may allow for additional cooling to be provided to those locations or portions in anticipation of temperature increases associated with a change in workload. For example, the cooling capacity of the working fluid flowing through the microfluidic volume may lag, relative to the substantially step-function of the heat-generation of a processing core executing a newly assigned task and beginning to provide additional cooling capacity to that processing core upon assignment of the task may be beneficial.

FIG. 1-1 illustrates an example of a processor 100 including a plurality of cores 102 and a cache 104. In some cases, a process or workload assigned to the processor 100 results in one region of the processor 100 dissipating more heat than other regions of the processor 100. For example, a first core 102-1 of the processor 100 may generate more heat while under load than the cache 104, resulting a hot spot 106. In other examples, a second core 102-2 may execute a task and generate more heat than the first core 102-1, resulting in a different hot spot 106. Under idle conditions, the processor 100 may be substantially uniform in temperature and not exhibit hot spots 106.

Figures 1, 2:
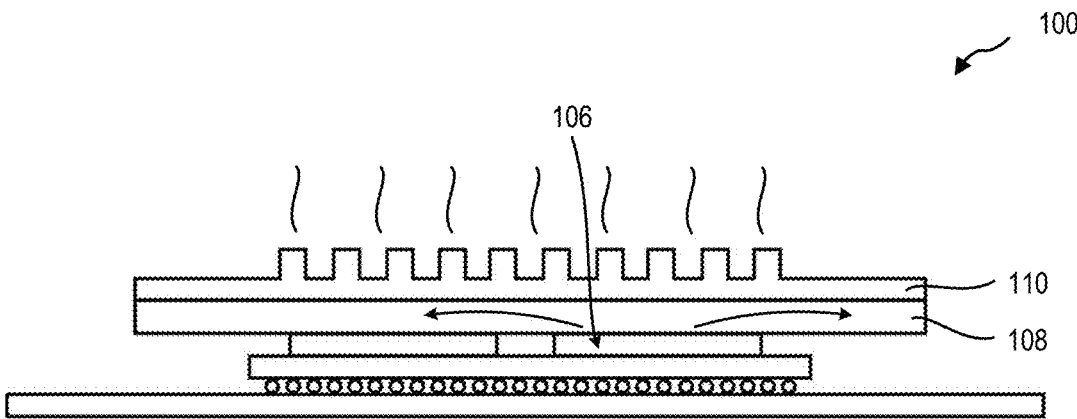

The heat from the hot spot 106 may be received by and/or transferred to a heat spreader 108, as shown in the side view of the processor 100 in FIG. 1-2. The heat spreader 108 may be a solid heat spreader 108, such as a copper heat spreader 108 that conducts the heat from the hot spot 106 through the heat spreader 108. In other examples, the heat spreader 108 may be a vapor chamber that contains a fluid therein to spread the heat across the heat spreader 108. In some examples, the heat spreader 108 conducts the heat to a heat sink 110 which then exhausts the heat. However, a conventional heat spreader and heat sink 110 requires a substantial volume within an electronic device. For example, the clearance required for a heat spreader and heat sink may not be available in some electronic devices. Additionally, the thermal interfaces between the processor 100 and the heat spreader 108, as well as between the heat spreader 108 and the heat sink 110, may degrade over time and compromise the efficiency of the thermal management.

Microfluidic thermal management devices require smaller clearances and may have benefits cooling heat-generating components with high compute density and/or in smaller electronic devices. FIG. 2-1 is a side cross-sectional view of an embodiment of a thermal management device 212 with a microfluidic volume 214. The microfluidic volume 214 is in fluid communication with a first port 216-1 and a second port 216-2. In some embodiments, the first port 216-1 is an inlet and a second port 216-2 is an outlet. In some embodiments, the first port 216-1 is an inlet and a second port 216-2 is an inlet, with a third port providing an outlet. In some embodiments, the first port 216-1 is an outlet and a second port 216-2 is an outlet, with a third port providing an inlet. As will be described herein, the first port 216-1 and/or second port 216-2 may be selectively changed between an inlet and an outlet.

FIG. 2-1 through 2-5 illustrate a first port 216-1 located at a first peripheral side 218-1 of the microfluidic volume 214 and a second port 216-2 located at a second peripheral side 218-2 of the microfluidic volume 214 opposite the first peripheral side 218-1. In some embodiments, the ports 216-1, 216-2 are located with any relationship relative to one another and the microfluidic volume 214 to provide fluid communication between the ports 216-1, 216-2 and the microfluidic volume 214.

In some embodiments, the first port 216-1 and/or second port 216-2 include a valve associated therewith to selectively allow fluid flow through the port. FIG. 2-1 through 2-5 illustrate an embodiment of a thermal management device 212 with an inlet valve 220 positioned at the first port 216-1 and an outlet valve 222 positioned at the second port 216-2. The inlet valve 220 includes an inlet valve membrane 224 that is movable between an open position and a closed position. In the open position, at least a portion of the inlet valve membrane 224 is displaced from a seat of the inlet valve 220 and allows fluid communication through the first port 216-1 to the microfluidic volume 214. In the closed position, the inlet valve membrane 224 seats against the seat of the inlet valve 220 and limits and/or prevents fluid flow through the first port 216-1. In some embodiment, the outlet valve 222 includes an outlet valve membrane 226 that is movable between an open position and a closed position. In the open position, at least a portion of the outlet valve membrane 226 is displaced from a seat of the outlet valve 222 and allows fluid communication through the second port 216-2 to the microfluidic volume 214. In the closed position, the outlet valve membrane 226 seats against the seat of the outlet valve 222 and limits and/or prevents fluid flow through the second port 216-2.

In some embodiments, a piezoelectric element is positioned in mechanical communication with the inlet valve membrane 224 to selectively move at least a portion of the inlet valve membrane 224 between the open position and the closed position when an electric voltage or current is applied to the piezoelectric element. For example, the inlet valve membrane 224 is or includes the piezoelectric element, such that application of the electric voltage or current causes the inlet valve membrane 224 to change shape and move between the open position and the closed position. In some embodiments, a piezoelectric element is positioned in mechanical communication with the outlet valve membrane 226 to selectively move at least a portion of the outlet valve membrane 226 between the open position and the closed position when an electric voltage or current is applied to the piezoelectric element. For example, the outlet valve membrane 226 is or includes the piezoelectric element, such that application of the electric voltage or current causes the outlet valve membrane 226 to change shape and move between the open position and the closed position.

FIG. 2-2 illustrates the embodiment of a thermal management device 212 of FIG. 2-1 with the inlet valve 220 in an open position, providing fluid communication through the first port 216-1 to the microfluidic volume 214. In some embodiments, a power source is electrically coupled to the piezoelectric element (e.g., inlet valve membrane 224) of the inlet valve 220 to selectively move the inlet valve 220 to an open position, such as illustrated in FIG. 2-2. In some embodiments, the outlet valve 222 is in a closed position while the inlet valve 220 is in the open position, allowing flow of working fluid 228 through the first port 216-1 into the microfluidic volume 214 upon movement of a pumping membrane.

Figures 1, 2:
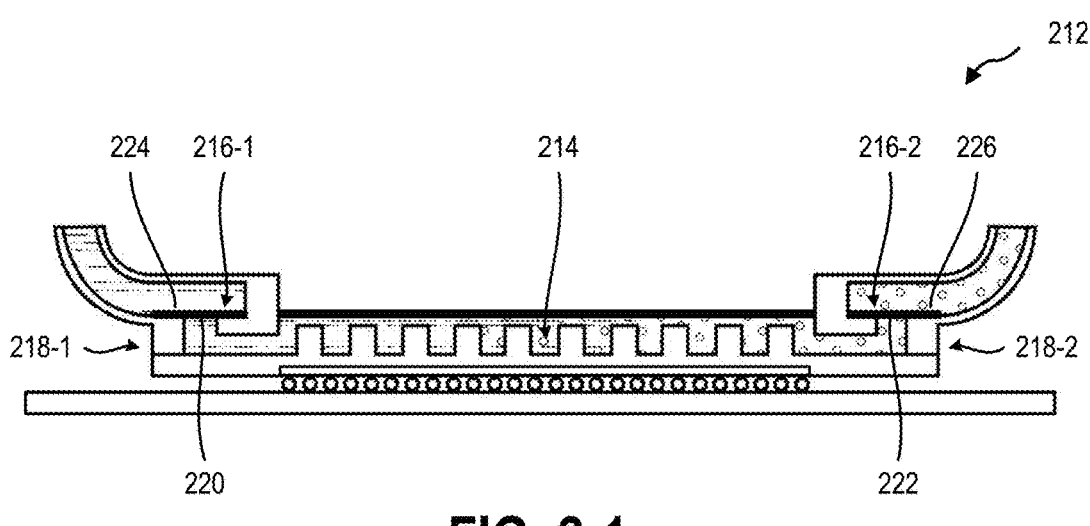
Figure 2:
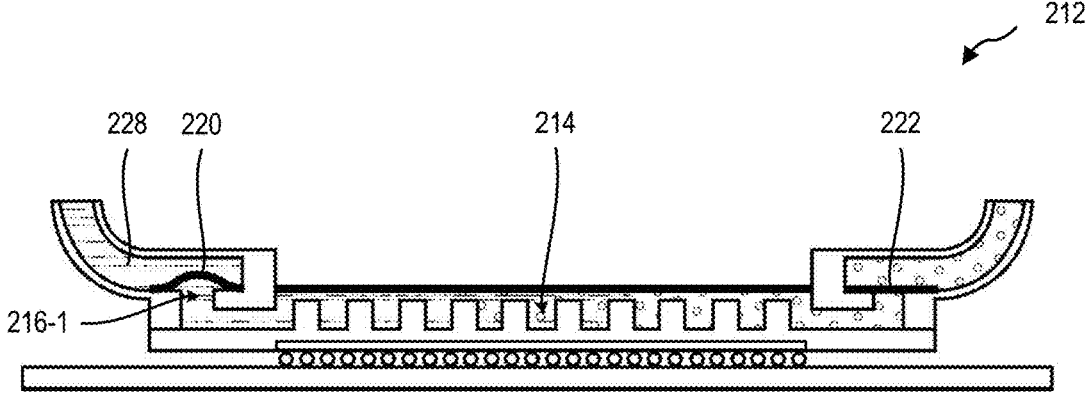
Figures 2, 3:
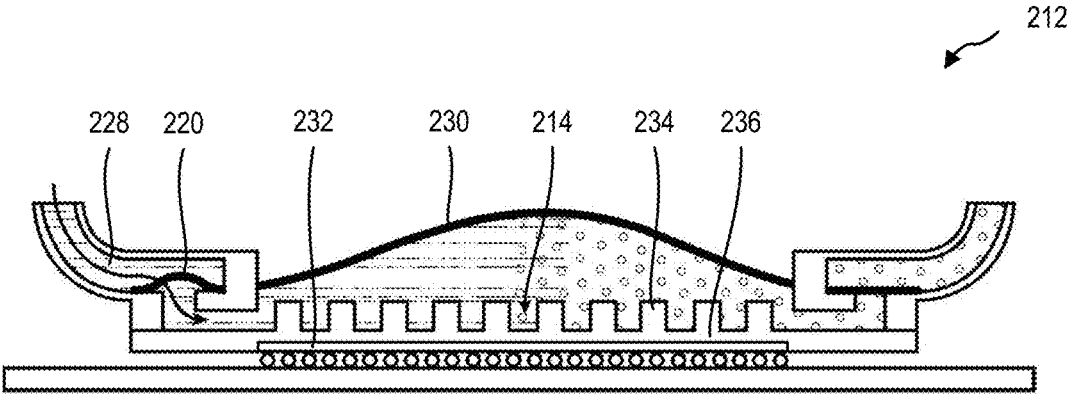

FIG. 2-3 illustrates the pumping membrane 230 of the thermal management device 212 moving to change a volume of the microfluidic volume 214. Upon expanding the volume of the microfluidic volume 214, the movement of the pumping membrane 230 generates a negative pressure in the microfluidic volume 214, which draws working fluid 228 into the microfluidic volume 214 past the inlet valve 220 in the open position.

The pumping membrane 230 is in mechanical communication with a piezoelectric element. The pumping membrane 230 may be or include a piezoelectric element that, when an electrical voltage or current is applied thereto, expands or contracts in at least one dimension and moves at least a portion of the pumping membrane 230. For example, the pumping membrane 230 may include a piezoelectric material such that the pumping membrane moves and changes a volume of the microfluidic volume 214. In some examples, the volume increases when an electrical voltage or current is applied to the piezoelectric element, such as illustrated in the embodiment of FIG. 2-3. In some examples, the volume decreases when an electrical voltage or current is applied to the piezoelectric element.

Upon expansion of the microfluidic volume 214, working fluid 228 is drawn into the microfluidic volume 214. In some embodiments, the working fluid 228 is a single-phase working fluid. For example, a single-phase working fluid 228 is a working fluid that remains in a single physical phase or state throughout the flow through the microfluidic volume 214. In some embodiments, a single-phase working fluid 228 has a boiling temperature at least 1° C. greater than an operating temperature of a heat-generating component (such the integrated circuit 232 of FIG. 2-3) cooled by the thermal management device 212. In some embodiments, a single-phase working fluid 228 has a boiling temperature at least 5° C. greater than an operating temperature of a heat-generating component cooled by the thermal management device 212. In some embodiments, a single-phase working fluid 228 has a boiling temperature at least 10° C. greater than an operating temperature of a heat-generating component cooled by the thermal management device 212. The working fluid 228 receives heat generated by the heat-generating component and, upon expulsion from the microfluidic volume 214, transfers the heat from the microfluidic volume 214, cooling the heat-generating component.

In some embodiments, the working fluid 228 is a two-phase working fluid. For example, a two-phase working fluid 228 is a working fluid that changes physical phase or state throughout the flow through the microfluidic volume 214. In some embodiments, the two-phase working fluid 228 changes from a liquid phase to a gaseous phase (e.g., vaporizes) after receiving heat from the heat-generating component while in the microfluidic volume 214. The change of phase from liquid phase to a gaseous phase allows the working fluid 228 to absorb heat without a substantial increase in temperature of the working fluid 228. The heat absorbed overcomes the latent heat of boiling to vaporize the working fluid 228 without increasing the temperature of the working fluid 228, thereby allowing the working fluid to absorb heat without an associated increase in temperature within the microfluidic volume 214.

The thermal management device 212 includes thermal elements 234 that increase surface area and/or contact area between the working fluid 228 and the heat-generating component or thermal interface therebetween. In some embodiments, one or more thermal elements 234 are integrally formed with or from the heat-generating components. In at least one example, the one or more thermal elements 234 are integrally formed with or from a crystal or substrate 236 (e.g., a die) of an integrated circuit 232 or other heat-generating components. In such examples, the working fluid 228 may provide on-die cooling and receive heat directly from the heat source, limiting or eliminating thermal interfaces that impair thermal conductivity away from the heat source.

In some embodiments, the thermal elements 234 include fins, grooves, ridges, pins, tubes, rods, cones, hoops, pipes, or other structures that increase the surface area between the substrate 236 or other heat source and the working fluid 228. In at least one example, the thermal element 234 further includes a boiling enhancement coating or surface feature that promotes boiling of a two-phase working fluid 228. For example, the boiling enhancement coating or surface feature may increase a temperature range over which the two-phase working fluid 228 exhibits nucleate boiling, increasing a temperature range over which the two-phase working fluid 228 most efficiently absorbs heat from the thermal element 234.

Figures 2, 3, 4:
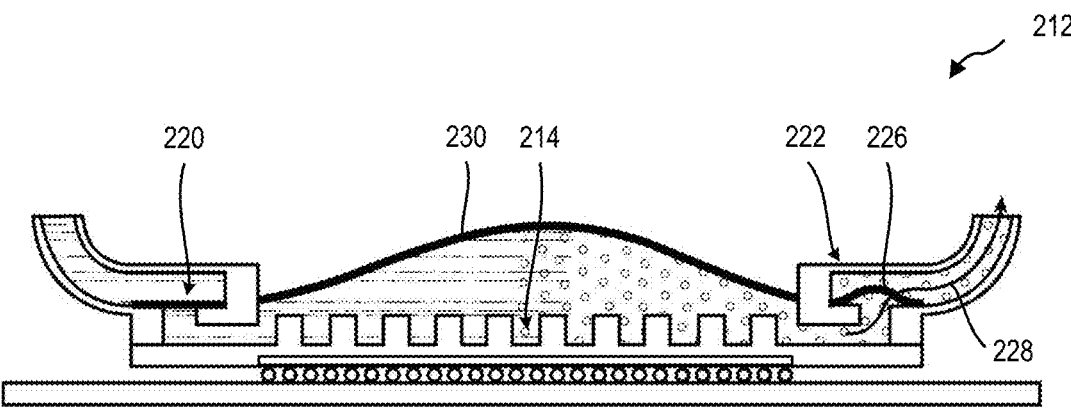

The thermal management device 212 then expels the working fluid 228 from the microfluidic volume 214. FIG. 2-4 illustrates the embodiment of a thermal management device 212 with an outlet valve 222 in an open position to allow fluid flow through the outlet valve 222 from the microfluidic volume 214. In some embodiments, a power source is electrically coupled to the piezoelectric element (e.g., outlet valve membrane 226) of the outlet valve 222 to selectively move the outlet valve to an open position, such as illustrated in FIG. 2-4. In some embodiment, the piezoelectric element opens the outlet valve upon application of the electric voltage or current to the piezoelectric element.

To ensure the working fluid 228 does not flow back through the inlet valve 220, the inlet valve 220 is moved to a closed position, such as by removing an electrical voltage or current from a piezoelectric element of the inlet valve. In some examples, the inlet valve membrane 224 restores to the closed position elastically upon removal of the electrical voltage or current. In other examples, the electrical voltage or current applied to the piezoelectric element is inverted, moving the inlet valve membrane 224 to the closed position.

FIG. 2-5 illustrates the embodiment of a thermal management device of FIG. 2-1 through FIG. 2-4 after expelling hot working fluid 228 from the microfluidic volume 214 through the outlet valve 222. In some embodiments, the pumping membrane 230 moves or changes shape to decrease the volume of the microfluidic volume. Decreasing the volume of the microfluidic volume 214 generates a positive pressure therein. While the inlet valve 220 is in a closed position, the positive pressure results in at least a portion of the working fluid 228 flowing past the thermal elements 234 of the thermal management device 212 and out the outlet valve 222. The working fluid 228 carries heat out of the thermal management device 212.

In some embodiments, the pumping membrane 230 decreases the volume of the microfluidic volume 214 upon removal of the electrical voltage or current applied thereto. For example, the pumping membrane 230 restores to the original position (such as illustrated in FIG. 2-2) elastically upon removal of the electrical voltage or current from the piezoelectric element. In other examples, the electrical voltage or current applied to the piezoelectric element of the pumping membrane 230 is inverted, moving the pumping membrane 230 to decrease the volume of the microfluidic volume 214.

While actively controlled valves (e.g., containing or having piezoelectric elements associated therewith) are described in relation to FIG. 2-1 through FIG. 2-5, other embodiments include one or more passive valves. For example, FIG. 3-1 through FIG. 3-5 illustrate an embodiment of a thermal management device 312 including a pumping membrane 330 that changes a volume of a microfluidic volume 314 of the thermal management device 312. As the pumping membrane 330 moves and/or changes shape, the changing volume of the microfluidic volume 314 moves working fluid 328 through one-way valves or check valves of the thermal management device 312.

FIG. 3-1 schematically illustrates a power source 336 electrically coupled to a pumping piezoelectric element 338 in mechanical communication with the pumping membrane 330. Because the pumping piezoelectric element 338 is coupled to a surface of the pumping membrane 330, changes in a longitudinal dimension of the pumping piezoelectric element 338 when an electrical voltage or current is applied by the power source 336 causes an associated change in shape of the pumping membrane 330.

In a static state, with no change in the electrical voltage or current applied to the pumping piezoelectric element 338, there is no flow of the working fluid 328 through the microfluidic volume 314 and/or through the inlet valve 320 or outlet valve 322. For example, a biasing force of the inlet valve 320 or outlet valve 322 may hold a membrane or other element of the inlet valve 320 or outlet valve 322 against a seat of the valve, holding the valve in a closed position.

As shown in FIG. 3-2, upon application of an electric voltage or current by the power source 336 to the pumping piezoelectric element 338, the pumping piezoelectric element 338 changes in at least one dimension, moving the pumping membrane 330 to increase a volume of the microfluidic volume 314. The increase in volume of the microfluidic volume 314 generates a negative pressure in the microfluidic volume 314. In some embodiments, the negative pressure is sufficient to overcome the biasing force of the inlet valve 320, moving the inlet valve 320 to an open position and allowing fluid flow therethrough and into the microfluidic volume 314, such as shown in FIG. 3-3. The working fluid 328 flows through the inlet valve 320 until the pumping membrane 330 stops moving or the negative pressure is decreased to allow the inlet valve 320 to restore to a closed position, such as shown in FIG. 3-4.

Figures 2, 3, 4, 5:
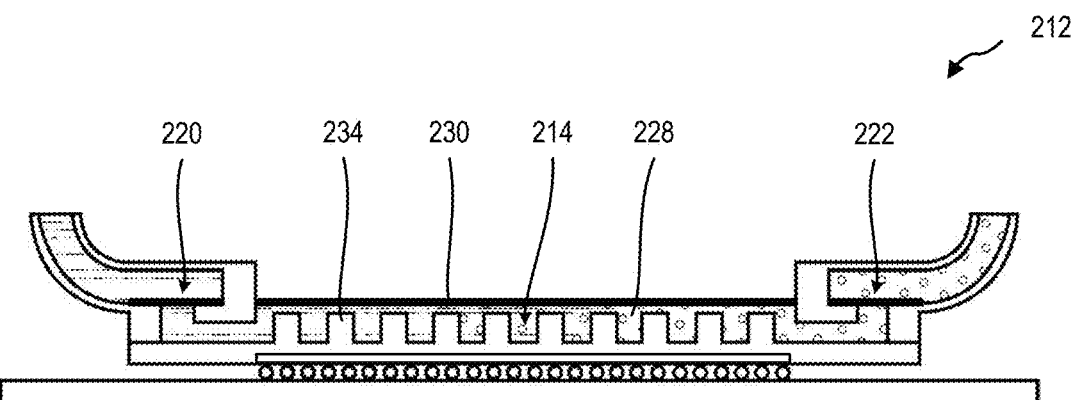
Figures 1, 3:
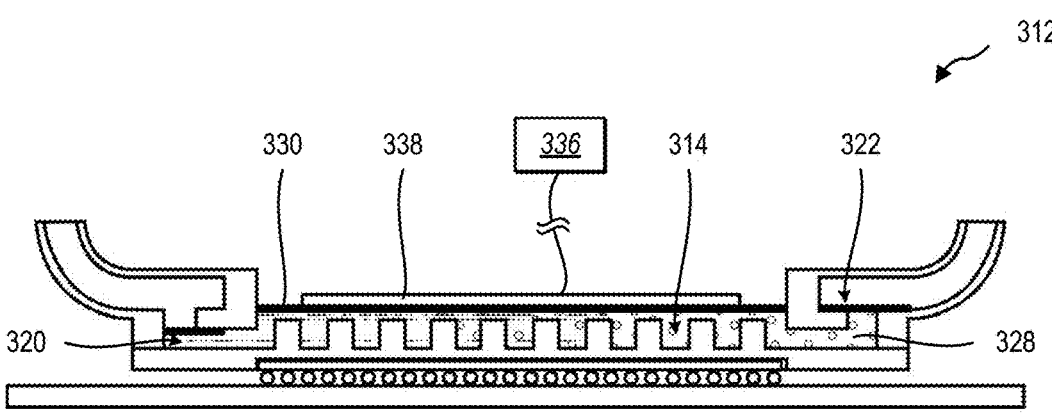
Figures 2, 3:
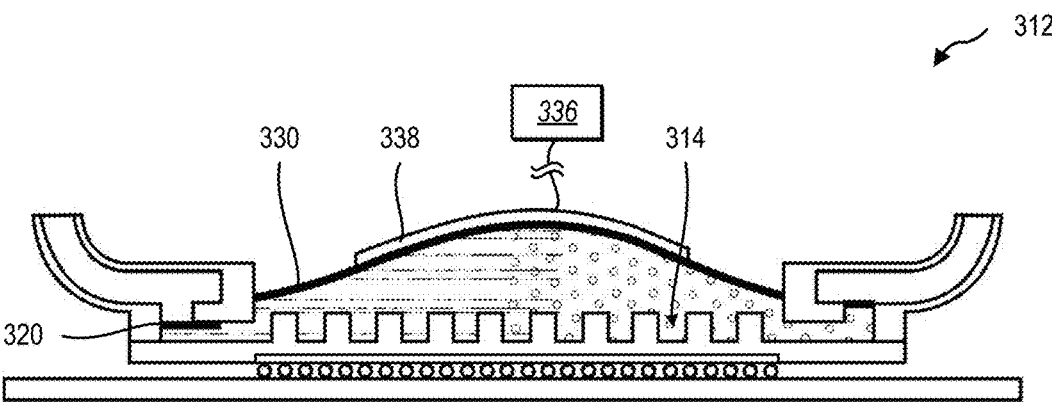
Figure 3:
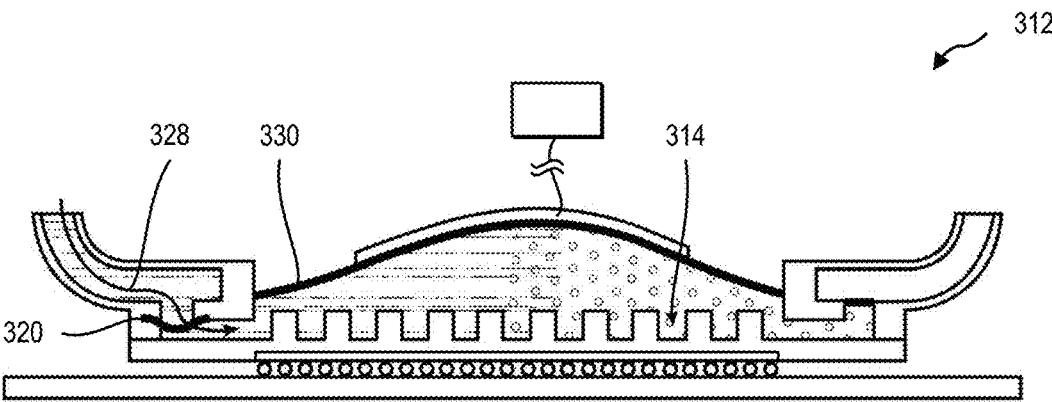
Figures 3, 4:
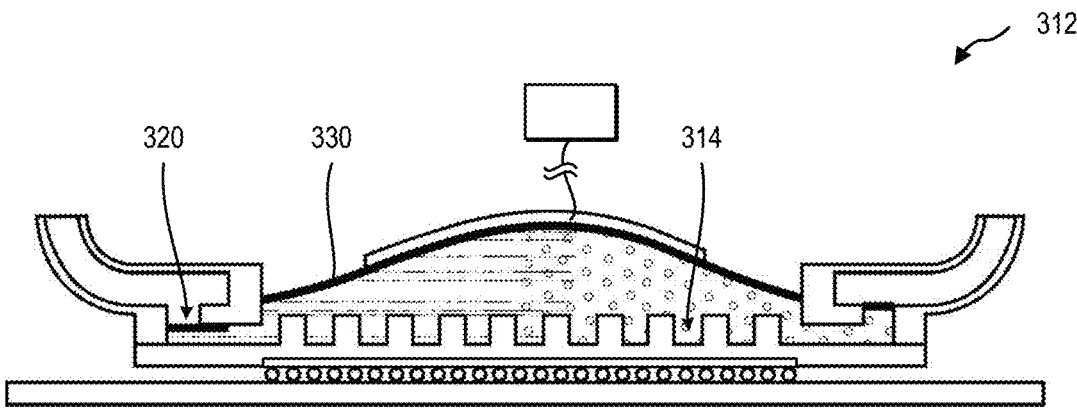
Figures 3, 4, 5:
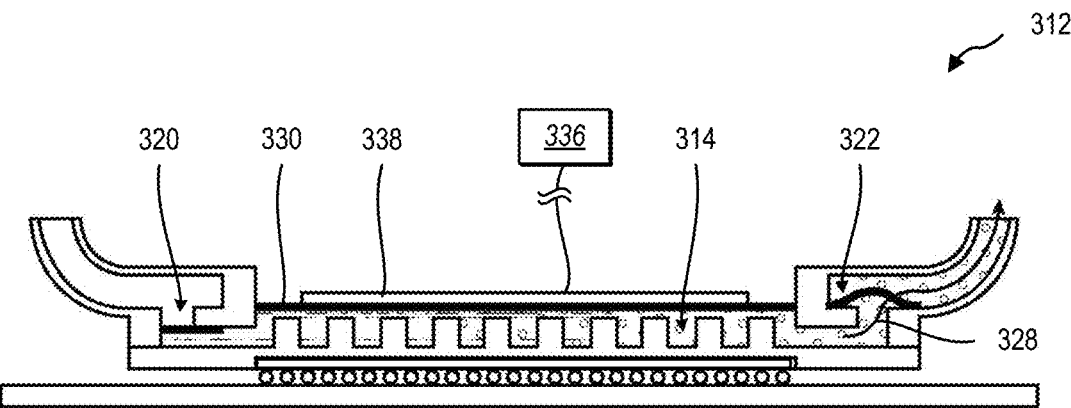
Figures 1, 4:
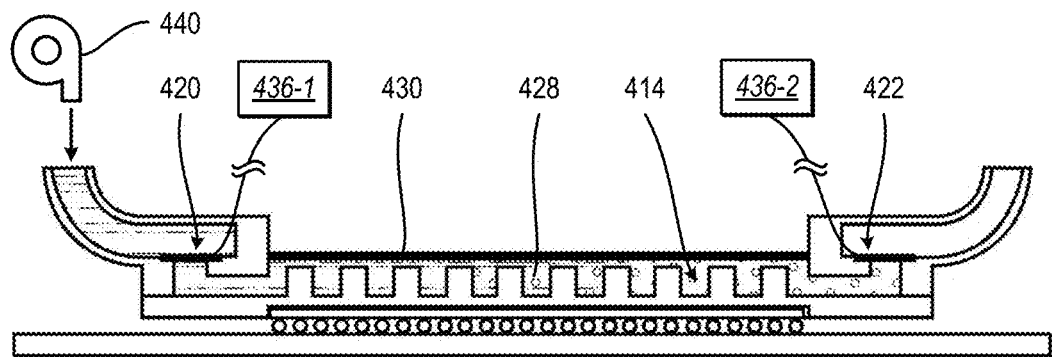
Figures 2, 4:
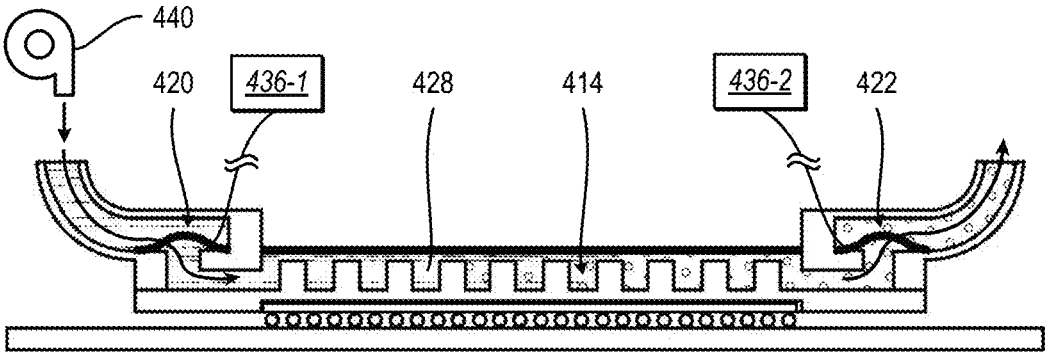
Figures 3, 4:
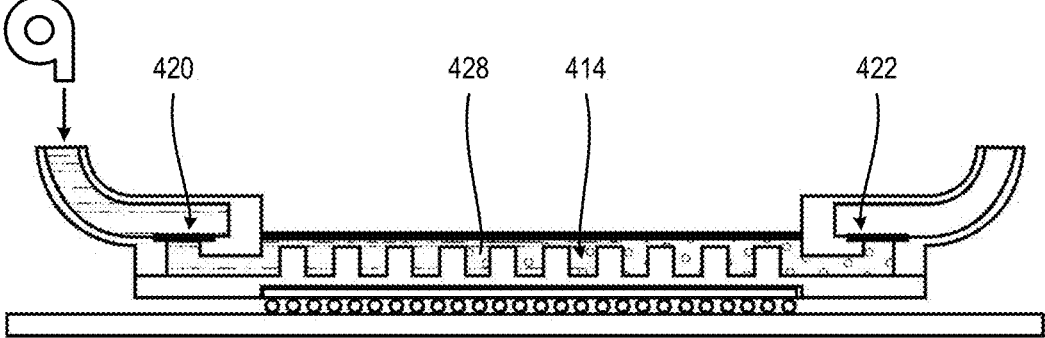
Figures 2, 5:
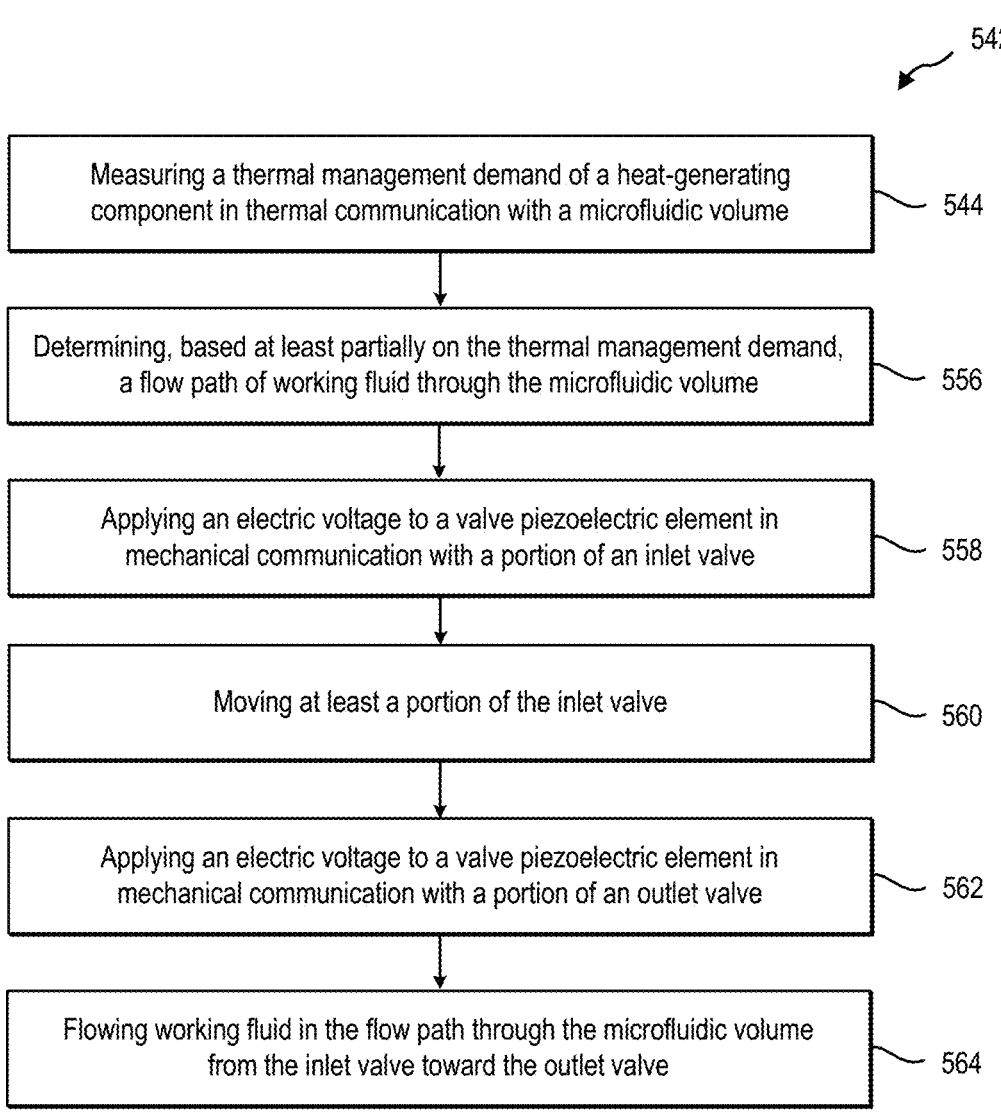

FIG. 3-5 illustrates the pumping membrane 330 moving to decrease a volume of the microfluidic volume 314 and generate a positive pressure in the microfluidic volume 314. In some embodiments, the positive pressure applies a force to the inlet valve 320 that seats the inlet valve 320, thereby limiting and/or preventing backflow of the working fluid 328 through inlet valve 320, and a force to the outlet valve 322. The force applied to the outlet valve 322 is sufficient to overcome a biasing force of the outlet valve 322 and move the outlet valve 322 toward an open position. The hot working fluid 328 is thereby expelled from the microfluidic volume 314 upon the pumping membrane 330 moving toward the microfluidic volume 314.

In some embodiments, the pumping membrane 330 moves or changes shape based at least partially on elastic restoration after the electrical voltage or current from the power source 336 is removed from the pumping piezoelectric element 338. In some embodiments, the pumping piezoelectric element 338 moves or changes shape based at least partially on elastic restoration after the electrical voltage or current from the power source 336 is removed, urging the pumping membrane 330 toward an original state. In some embodiments, the power source 336 applies a second electrical voltage or current that is different from or the inverse of the first electrical voltage or current to the pumping piezoelectric element 338. Upon application of the second electrical voltage or current, the pumping piezoelectric element 338 changes shape in at least one dimension, moving the pumping membrane 330 to the original position, such as shown in FIG. 3-5. The working fluid 328 flows through the outlet valve 322 until the pumping membrane 330 stops moving or the positive pressure is decreased to allow the outlet valve 322 to restore to a closed position, such as shown in FIG. 3-1. In some embodiments, the cycle may then begin again.

While embodiments described herein may include a pumping membrane that is actuatable between different positions and/or shapes to urge working fluid through a microfluidic volume, in some embodiments, valves control working fluid flow through the microfluidic volume that is pressurized by an external pump. For example, FIG. 4-1 illustrates an embodiment of a thermal management device configured to control working fluid flow through a microfluidic volume 414 using at least one selectively actuated piezoelectric valve. The selectively actuated piezoelectric valve controls fluid communication between a pump 440 (or a source conduit in communication with the pump 440) and the microfluidic volume 414 of the thermal management device.

In some embodiments, the pumping membrane 430 is substantially rigid during the working fluid flow through the microfluidic volume 414. For example, and in contrast to some embodiments described herein, the microfluidic volume 414 is partially bounded by a membrane opposite the thermal elements that is substantially rigid and does not move while working fluid 428 flows through the microfluidic volume 414. In some embodiments, the pumping membrane 430 is an elastic membrane that moves upon the introduction of additional working fluid 428 into the microfluidic volume 414 to accommodate the additional working fluid 428 in the microfluidic volume 414. For example, the inlet valve 420 may open to allow working fluid 428 pressurized by the pump 440 to enter the microfluidic volume 414. In some embodiments, the outlet valve 422 remains closed, and the pumping membrane 430 elastically deforms to increase the volume of the microfluidic volume 414. Upon closure of the inlet valve 420 and opening the outlet valve 422, the elastic energy of the pumping membrane 430 may then urge the working fluid 428 out of the microfluidic volume through the open outlet valve 422. The sequential opening of the valves 420, 422 may create a passive pumping membrane 430 that pumps working fluid 428 from the microfluidic volume 414 after the pump 440 urges the working fluid 428 into the microfluidic volume 414.

FIG. 4-2 illustrates the thermal management device of FIG. 4-1 with the inlet valve 420 and outlet valve 422 opened simultaneously. In such an embodiment, a pump 440 delivers working fluid 428 to the microfluidic volume 414 while the inlet valve 420 is in an open position. The working fluid 428 flows through the microfluidic volume 414 and out of the microfluidic volume 414 through the open outlet valve 422. In some embodiments, the inlet valve 420 and the outlet valve 422 are both actively actuatable by a power source or power sources (such as the power sources 436-1, 436-2). In other embodiments, at least one of the inlet valve 420 and the outlet valve 422 is a passive valve that opens when a sufficient fluid pressure is applied to the valve. In at least one example, the inlet valve 420 is actuatable by application of an electrical voltage or current to a piezoelectric element, while the outlet valve 422 is a passive valve that allows flow of working fluid 428 out of the microfluidic volume 414 while limiting and/or preventing flow of working fluid 428 into the microfluidic volume 414. For example, a biasing force, such as an elastic restoring force, of the outlet valve 422 may cause the outlet valve 422 to seat when a net pressure from the microfluidic volume 414 is not positive or below a positive threshold pressure. For example, upon closure of the inlet valve 420 illustrated in FIG. 4-3, flow of the working fluid 428 stops into the microfluidic volume 414. Without a positive pressure from the microfluidic volume 414, the net pressure across the outlet valve 422 is insufficient to move or hold the outlet valve 422 in the open position, and the outlet valve 422 closes.

In some embodiments, the active control of the valve(s) and/or the pumping membrane is determined based at least partially on a thermal management demand of the heat-generating component being cooled by the thermal management device. FIG. 5-1 is a flowchart illustrating an embodiment of a method 542 of thermal management with a thermal management device according to at least some embodiments of the present disclosure. In some examples, the method 542 of thermal management includes obtaining a thermal management demand of a heat-generating component in thermal communication with a microfluidic volume at 544. In some embodiments, the thermal management demand includes a local region of the microfluidic volume for the thermal management demand. For example, the thermal management demand may vary based on different regions of the heat-generating components. In some embodiments, obtaining a thermal management demand of a heat-generating component includes measuring or receiving a temperature of at least a portion of the heat-generating component. Obtaining the thermal management demand may include obtaining a plurality of thermal management demands of the heat-generating component based at least partially on a plurality of temperatures associated with different local regions. In at least one example, a processor may have different cores, caches, or other components in different areas of the processor, and the local regions may correlate to the components. In at least another example, the heat-generating device may be considered in a grid of local regions (e.g., a 3×3 grid of 9 local regions) with different thermal management demands associated with each of the local regions. In some examples, a thermal management device according to the present disclosure may be in electrical communication with a controller and/or power source that measures a thermal management demand of the heat-generating component. In at least one example, a controller and/or power source may be in electrical communication with a thermocouple or other temperature sensor(s) of the heat-generating component, and the controller and/or power source may report the thermal management demands of the In some examples, the thermal management demands are based at least partially on temperature measurements of one or more local regions (e.g., different locations or portions) of the heat-generating component, which may allow for additional cooling to those local regions in response to increases in temperature. In some examples, the thermal management demands are based at least partially on power draw measurements of one or more local regions of the heat-generating component, which may allow for additional cooling to be provided to those local regions in anticipation of temperature increases associated with power draw increases. In some examples, the thermal management demands are based at least partially on workload measurements or reports of one or more portions of the heat-generating component, which may allow for additional cooling to be provided to those local regions in anticipation of temperature increases associated with a change in workload. For example, the cooling capacity of the working fluid flowing through the microfluidic volume may lag, relative to the substantially step-function of the heat-generation of a processing core executing a newly assigned task, and beginning to provide additional cooling capacity to that processing core upon assignment of the task may be beneficial.

In some embodiments, the method 542 further includes determining, based at least partially on the thermal management demand, a target flow rate of working fluid through the microfluidic volume at 546. In some embodiments, the controller or power source may determine a target flow rate of the working fluid based on a size of a port(s) of the thermal management device and the available flow rate of a pumping membrane positioned in the microfluidic volume.

The method 542 further includes applying an electric voltage or current to a pump piezoelectric element in mechanical communication with the pumping membrane at 548 and moving at least a portion of the pumping membrane at 550. For example, as described in relation to FIG. 3-1 through FIG. 3-5, the pumping membrane may have a pump piezoelectric element coupled thereto, such that a contraction or expansion of the pump piezoelectric element in at least one dimension cause a movement of at least a portion of the pumping membrane. In some examples, such as described in relation to FIG. 2-1 through 2-5, the pumping membrane may be the pump piezoelectric element and the electric voltage or current is applied to the pumping membrane to cause the pumping membrane to move and/or change shape.

The movement of the pumping membrane may result in altering a volume of the microfluidic volume based at least partially on the target flow rate at 552, and as described in relation to FIG. 2-1 through 3-5, changes in volume may be associated with pressure changes. The method 542 further includes flowing working fluid into the microfluidic volume through an inlet of the microfluidic volume at 554. In some embodiments, the pressure differential across the inlet drives working fluid into the microfluidic volume. In some embodiments, an external pump pressurizes the working fluid to urge the working fluid into the microfluidic volume.

FIG. 5-2 is a flowchart illustrating an embodiment of another method 542 of thermal management with a passive pumping membrane or no pumping membrane in a microfluidic volume. In some embodiments, the method 542 includes measuring a thermal management demand of a heat-generating component in thermal communication with a microfluidic volume at 544, similar to as described in relation to FIG. 5-1. In some embodiments, the thermal management demand includes a local region of the microfluidic volume for the thermal management demand. The method 542 further includes determining, based at least partially on the thermal management demand, a flow path of working fluid through the microfluidic volume at 556.

In some embodiments, determining the flow path includes selecting one or more valves to selectively actuate to direct working fluid from an inlet and through the microfluidic volume to an outlet. For example, the method 542 includes actuating at least one valve by applying an electric voltage or current to a valve piezoelectric element in mechanical communication with a portion of an inlet valve at 558. In some embodiments, the valve piezoelectric element moves or changes shape in response to the applied electric voltage or current, and the method 542 includes moving at least a portion of the inlet valve at 560. After opening the inlet valve, the method includes opening an outlet valve by applying an electric voltage or current to a valve piezoelectric element in mechanical communication with a portion of an outlet valve at 562.

Based at least partially on the location and actuation timing of the inlet valve and the outlet valve, the method 542 includes flowing working fluid in the flow path through the microfluidic volume from the inlet valve toward the outlet valve at 564.

It should be understood that the methods 542 described in relation to FIG. 5-1 and FIG. 5-2 may be used in concert with one another to control both the flow rate and the flow path of the working fluid, or the methods 542 described in relation to FIG. 5-1 and FIG. 5-2 may be used independently of one another. For example, the embodiment of the method 542 described in relation to FIG. 5-1 may be used to control the pumping membrane in the microfluidic volume of the thermal management device, and the method 542 described in relation to FIG. 5-2 may be used to control the valves of the thermal management device to provide a target flow rate and flow path through the microfluidic volume and provide adaptive cooling to the heat-generating component. In some embodiments, a method 542 of thermal management includes at least some or all portions of the method 542 described in relation to FIG. 5-1 and FIG. 5-2. For example, act 544 is performed in both methods shown in FIG. 5-1 and FIG. 5-2 while act 546 is shown as only performed in the method shown in FIG. 5-1. In some embodiments, act 546 may be performed in combination with the acts in both methods shown in FIG. 5-1 and FIG. 5-2 or in neither method shown in FIG. 5-1 and FIG. 5-2. Every permutation of the acts shown in FIG. 5-1 and FIG. 5-2 is contemplated.

Figures 1, 6:
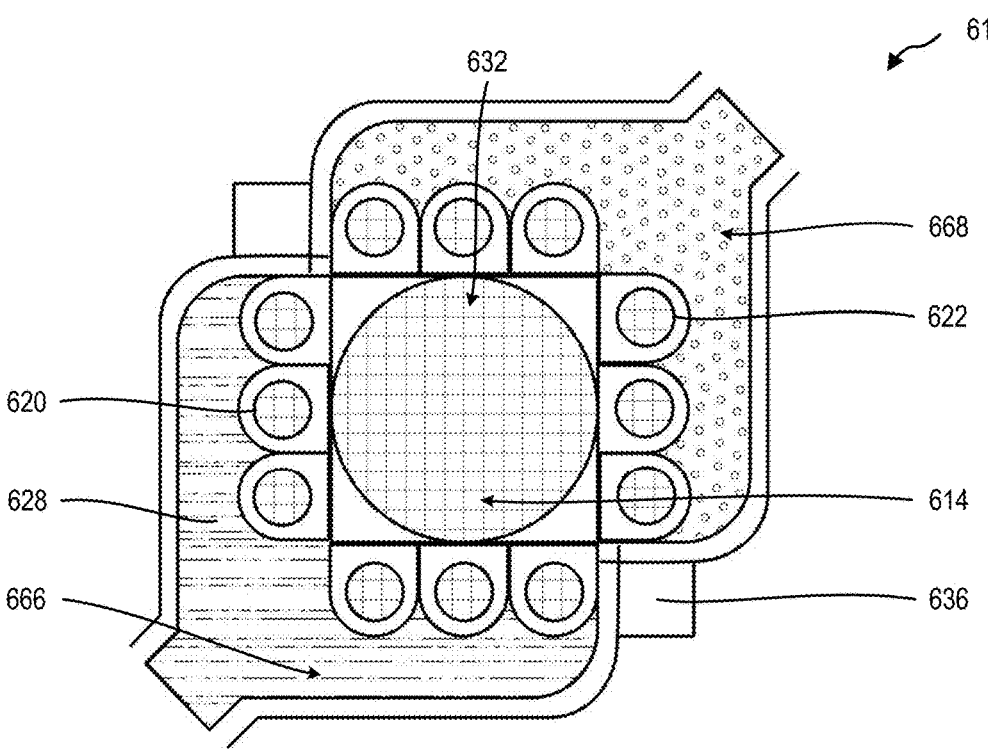
Figures 2, 6:
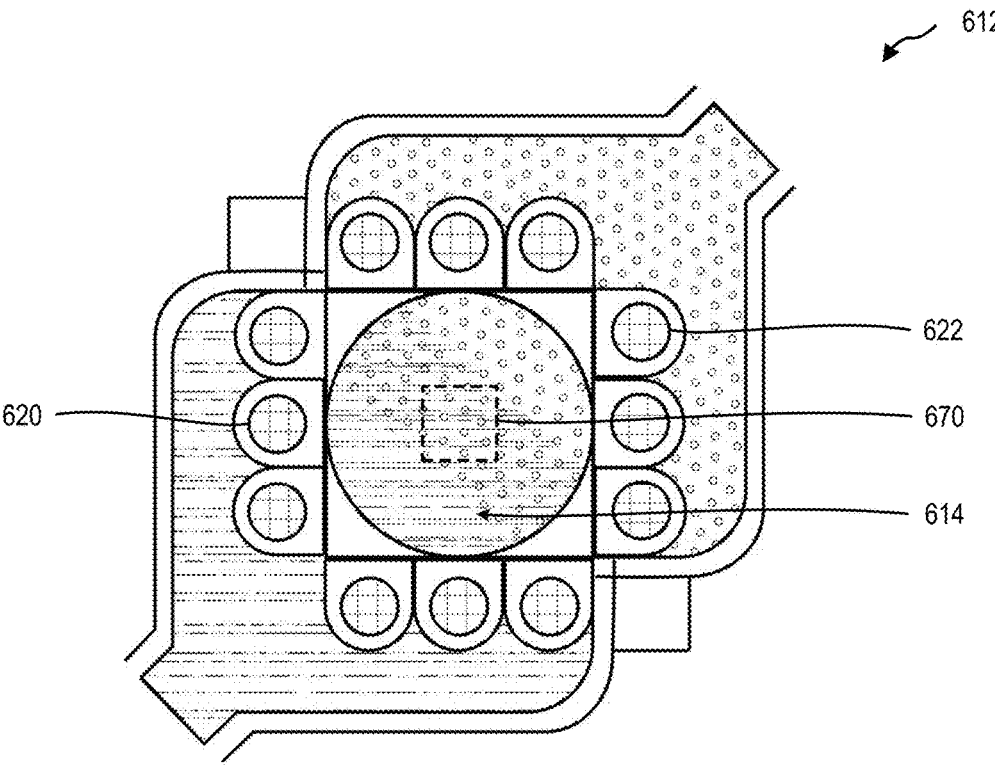
Figures 3, 6:
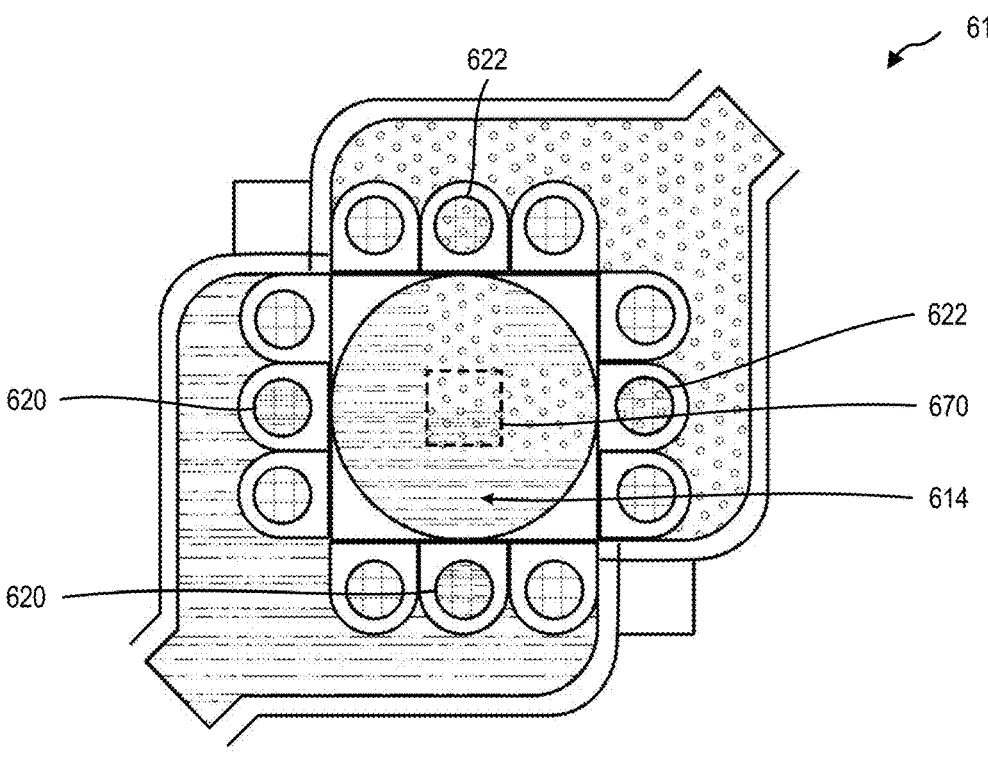
Figures 4, 6:
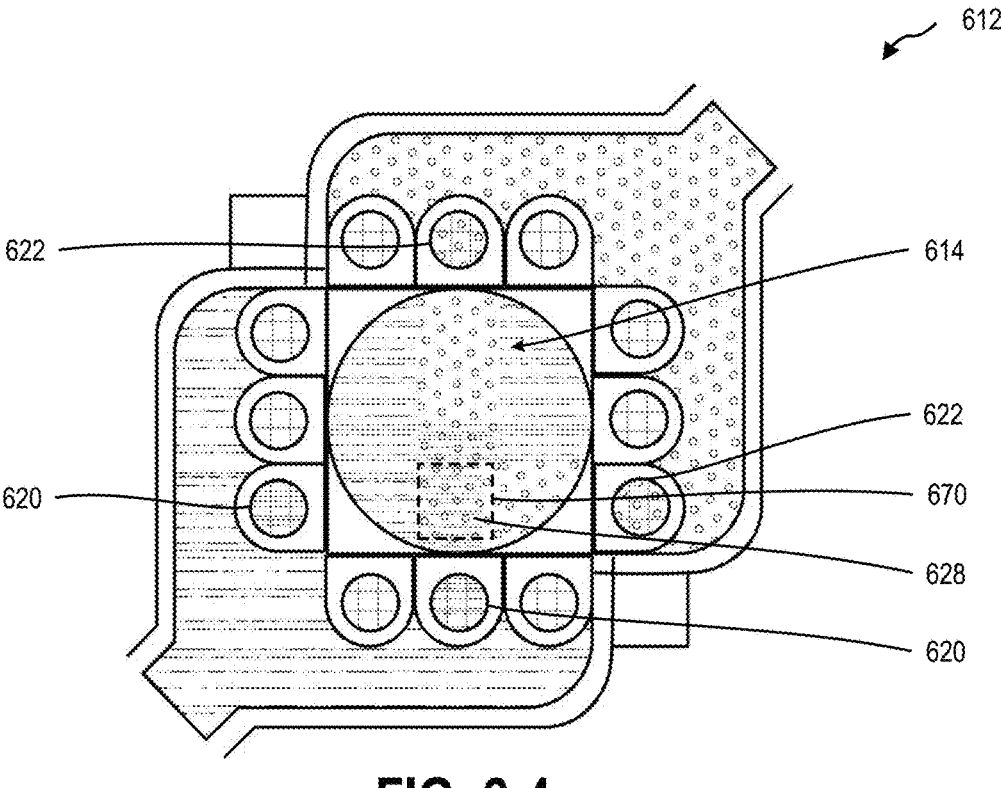

By selectively actuating valves in an array of valves and/or ports of the thermal management device, the thermal management device can change the flow path of the working fluid to direct cool or fresh working fluid at the hottest regions of the heat generating component. FIG. 6-1 through FIG. 6-4 are top views of an embodiment of a thermal management device selectively actuating valves to direct working fluid flow to regions of high thermal management demand. FIG. 6-1 is a top cross-sectional view of a thermal management device 612 that includes a plurality of inlets 620 and a plurality of outlets 622. The inlets 620 and outlets 622 provide fluid communication to the microfluidic volume 614 therebetween. In some embodiments, the inlets 620 provide fluid communication between an inlet manifold 666 and the microfluidic volume 614. For example, the array of inlets 620 can selectively allow the cool working fluid 628 from the inlet manifold 666 into the microfluidic volume 614 based at least partially on which of the inlets 620 is actuated and moved to an open position. In some embodiments, the outlets 622 provide fluid communication between the microfluidic volume 614 and an outlet manifold 668. For example, after the working fluid receives heat from the heat generating component 632 proximate the microfluidic volume 614, the array of outlets 622 can selectively allow the hot working fluid 628 out from the microfluidic volume 614 into the outlet manifold 668 based at least partially on which of the outlets 622 is actuated and moved to an open position.

In some embodiments, the thermal management device 612 is coupled to a substrate 636 of the heat-generating component 632. In some embodiments, the thermal management device 612 is supported by another component of the electronic device or computing device and contacts the heat-generating component 632.

Such as described in some embodiment of thermal management methods described herein, a controller or the thermal management device may measure a temperature, power draw, workload, or expected workload of one or more portions of the heat-generating component. FIG. 6-2 illustrates the thermal management device 612 of FIG. 6-1 with a hot spot 670 determined proximate the microfluidic volume 614. In some embodiments, the hot spot 670 is located in the center of the microfluidic volume 614. In other embodiments, the hot spot(s) 670 are located elsewhere relative to the microfluidic volume 614.

In some embodiments, the thermal management device or controller/power source in electrical communication with the valves 620, 622 selectively actuates at least one inlet valve 620 based at least partially on the location of the hot spot 670. In some embodiments, the thermal management device or controller/power source in electrical communication with the valves 620, 622 selectively actuates at least one outlet valve 622 based at least partially on the location of the hot spot 670. In some embodiments, the thermal management device or controller/power source in electrical communication with the valves 620, 622 selectively actuates at least one inlet valve 620 and at least one outlet valve 622 based at least partially on the location of the hot spot 670.

FIG. 6-3 illustrates the thermal management device 612 of FIG. 6-1 and FIG. 6-2 with two inlet valves 620 actuated and two outlet valves 622 actuated to direct working fluid 628 through the microfluidic volume 614 toward the hot spot 670. FIG. 6-4 illustrates the thermal management device 612 of FIG. 6-3 with two inlet valves 620 actuated and two outlet valves 622 actuated to direct working fluid 628 through the microfluidic volume 614 toward a different hot spot 670. In some embodiments, more or less valves are opened to change the flow volume, flow path, flow rate, or combinations thereof through the microfluidic volume 614. For example, opening all valves may increase the flow volume of working fluid 628. In some examples, opening less valves than all valves may increase the flow rate of working fluid 628, such as when a fluid pressure of the inlet manifold 666 and/or outlet manifold 668 is constant.

Figure 7:
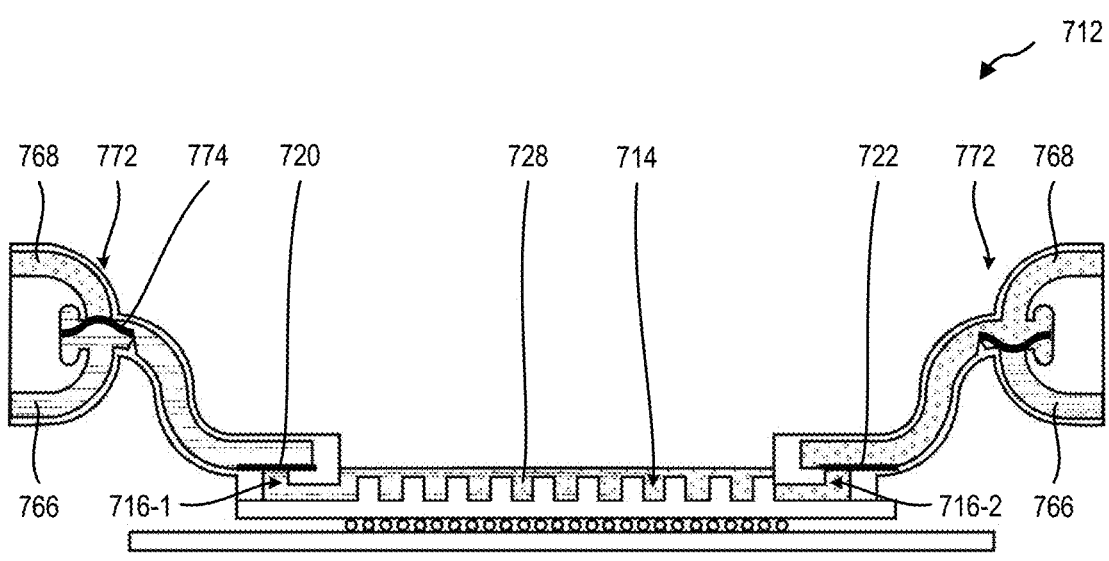
FIG. 7 is a side cross-sectional view of a microfluidic thermal management device with bi-directional manifolds, according to at least some embodiments of the present disclosure.

FIG. 7 is a side cross-sectional view of an embodiment of a thermal management device 712 with a bi-directional manifold 772 at each of a first port 716-1 and a second port 716-2. In some embodiments, a bi-directional manifold 772 allows a port 716-1, 716-2 to selectively function as an inlet or an outlet. For example, the bi-directional manifold 772 includes a movable element 774 therein that opens or closes fluid communication with the inlet manifold 766 and the outlet manifold 768. For example, in a first position, the movable element 774 seats against an opening to the outlet manifold 768 and opens an opening to the inlet manifold 766, allowing fluid communication between the inlet manifold 766 and the microfluidic volume 714. When the bi-directional manifold 772 of the first port 716-1 is in the first position, the first port 716-1 functions as an inlet to the microfluidic volume 714. For example, in a second position, the movable element 774 seats against an opening to the inlet manifold 766 and opens an opening to the outlet manifold 768, allowing fluid communication between the outlet manifold 768 and the microfluidic volume 714. When the bi-directional manifold 772 of the second port 716-2 is in the second position, the second port 716-2 functions as an outlet from the microfluidic volume 714. In some embodiments, the movable element 774 is or is in mechanical communication with a piezoelectric element that, when an electrical voltage or current is applied thereto, moves between the first position and the second position.

In some embodiments, a valve positioned proximate a port (e.g., between the port and the bi-directional manifold) further controls fluid flow of the working fluid 728 through the microfluidic volume 714. While the bi-directional manifold 772 selectively changes the manifold to which the microfluidic volume is connected, the valve 720, 722 proximate the port 716-1, 716-2 selectively allows flow fluid between the manifold and the microfluidic volume 714.

Figure 8:
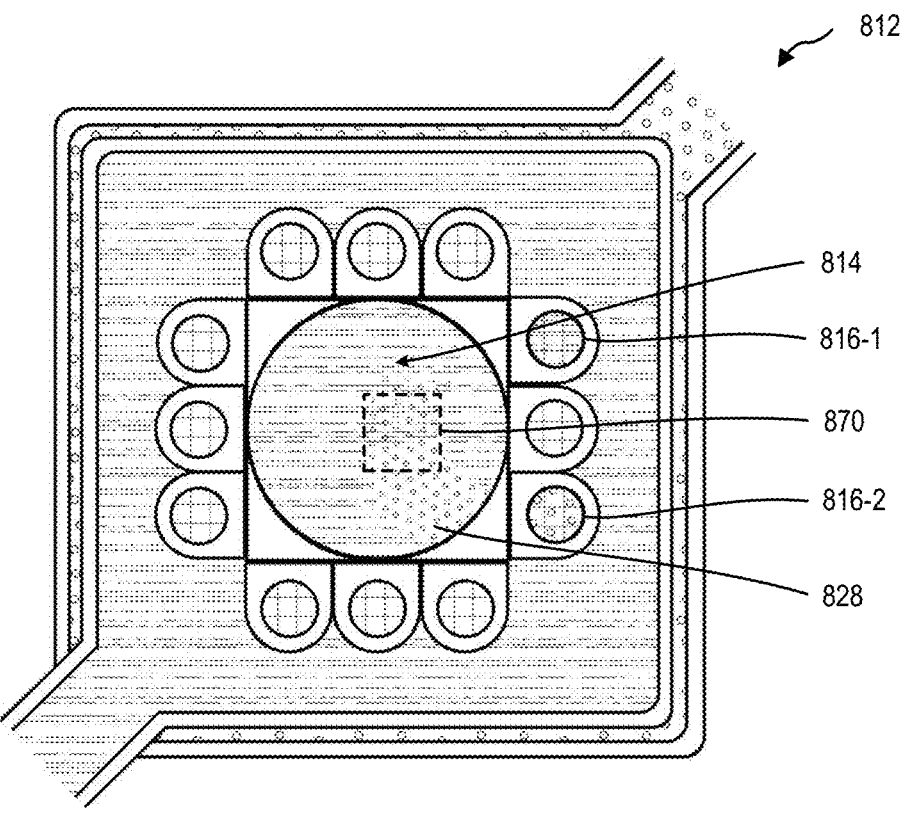
FIG. 8 is a top cross-sectional view of a microfluidic thermal management device with bi-directional manifolds, according to at least some embodiments of the present disclosure.

FIG. 8 is a top view of an embodiment of a thermal management device 812 selectively actuating bi-directional ports to direct working fluid flow to regions of high thermal management demand. For example, the bi-directional manifolds connected to the ports of the thermal management device 812 (such as the bi-directional manifolds of FIG. 7) may allow any ports to be bi-directional ports. In at least one embodiment, the first port 816-1 and the second port 816-2 are changed to be an inlet port and an outlet port, respectively, to direct flow of working fluid 828 through the microfluidic volume 814 to cool a hot spot 870.

Figure 9:
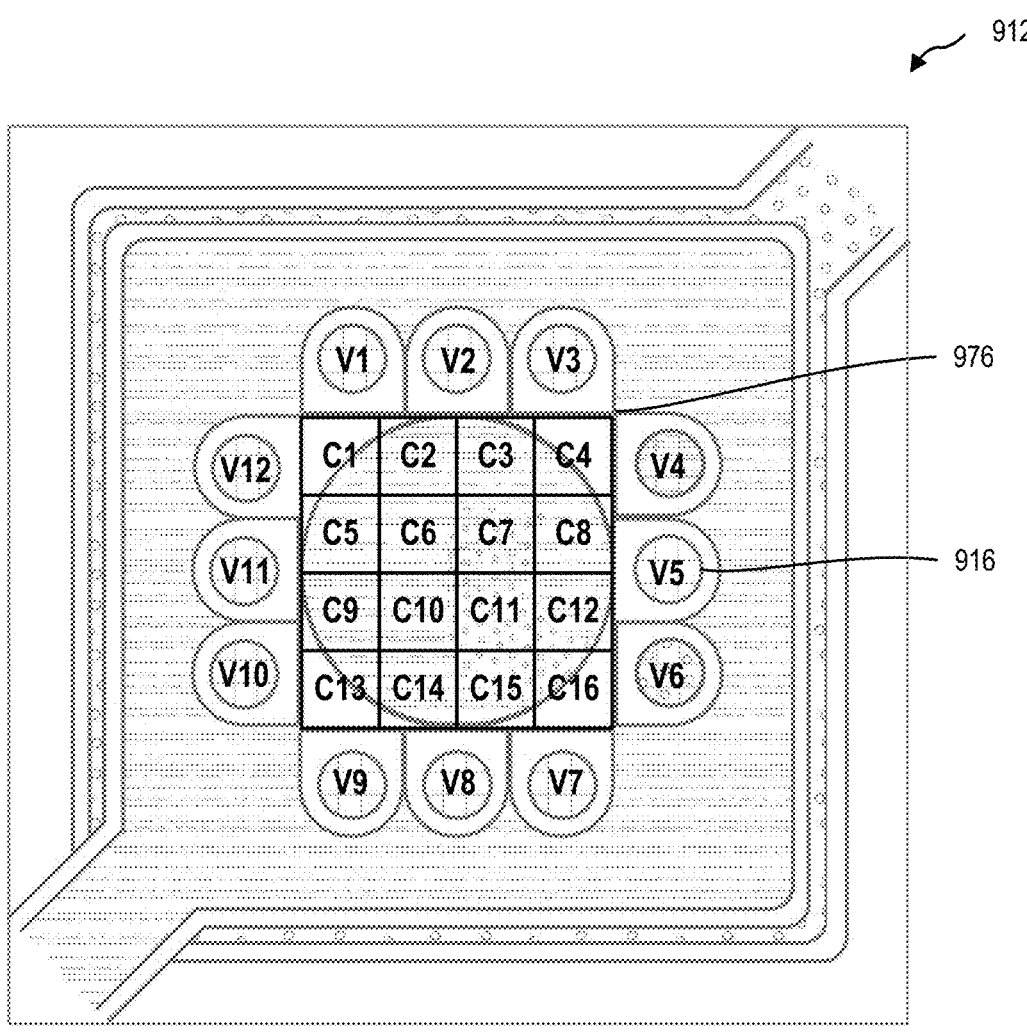
FIG. 9 is a top view of a microfluidic thermal management device with a grid of local regions superimposed thereon, according to at least some embodiments of the present disclosure.

FIG. 9 is a schematic representation of determining a valve and/or target flow rate of an embodiment of a thermal management device 912. In some embodiments, the microfluidic volume and/or the heat-generating component is mapped to a grid or other coordinate system to report a location of a hot spot. The grid 976 allows a controller or power source to associate ports 916 with different local regions on the grid 976 to determine which ports to open and in what position of the bi-directional manifold associated with the port, if relevant.

Figure 10:
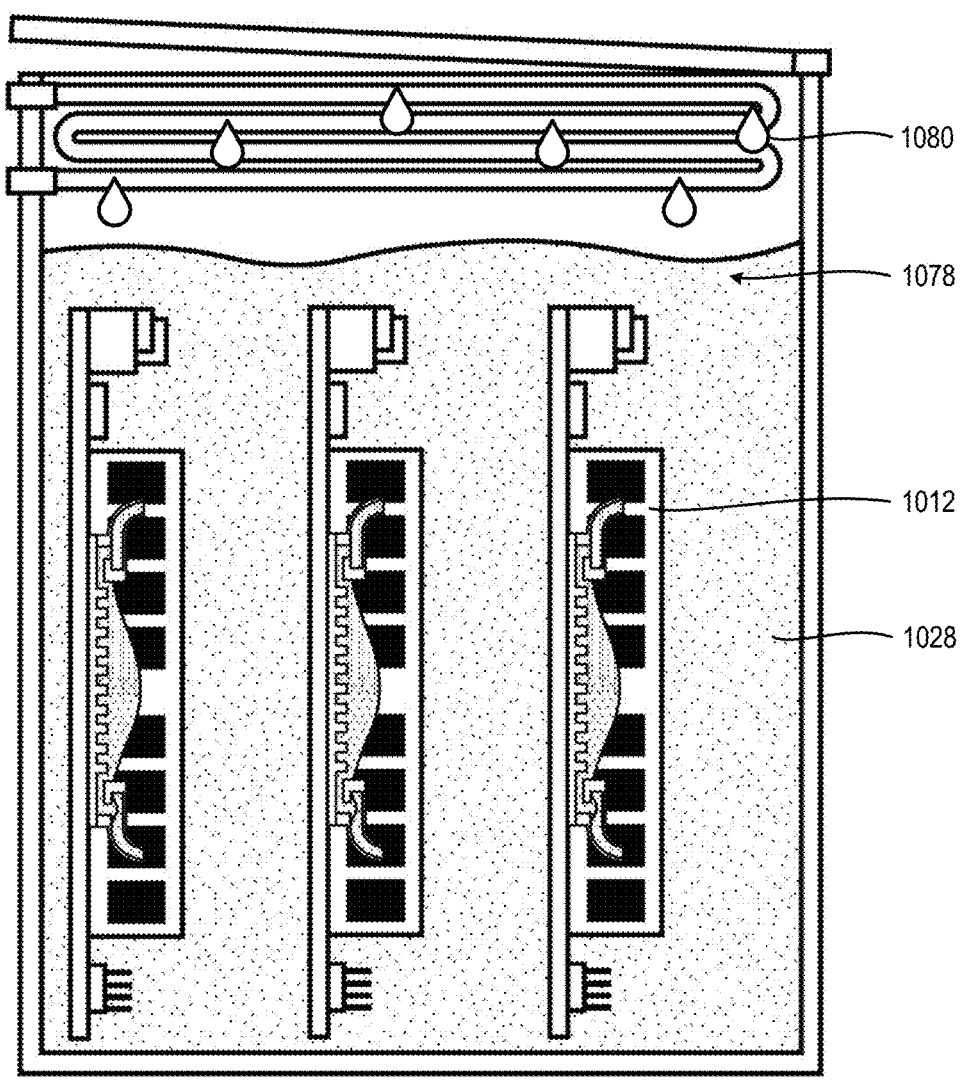
FIG. 10 is a schematic representation of a microfluidic thermal management device immersed in an immersion cooling system, according to at least some embodiments of the present disclosure.

In some embodiments, the thermal management device 912 is not connected to a manifold. FIG. 10 is a side view of a microfluidic thermal management device 1012 according to at least some of the embodiments described herein submerged in an immersion cooling system 1078. The immersion cooling system 1078 allows the thermal management device 1012 to be immersed in the working fluid 1028. In some embodiments, the immersion cooling system 1078 is a two-phase immersion cooling system 1078 and includes a condenser 1080 to condense a vapor phase of the working fluid 1028 into a liquid phase to allow the liquid working fluid 1028 to flow through the microfluidic volume. In some embodiments, the immersion cooling system 1078 is a single-phase immersion cooling system 1078. It should be understood that any embodiment of a thermal management device 1012 described herein may be immersed in an immersion cooling system 1078.

Figure 11:
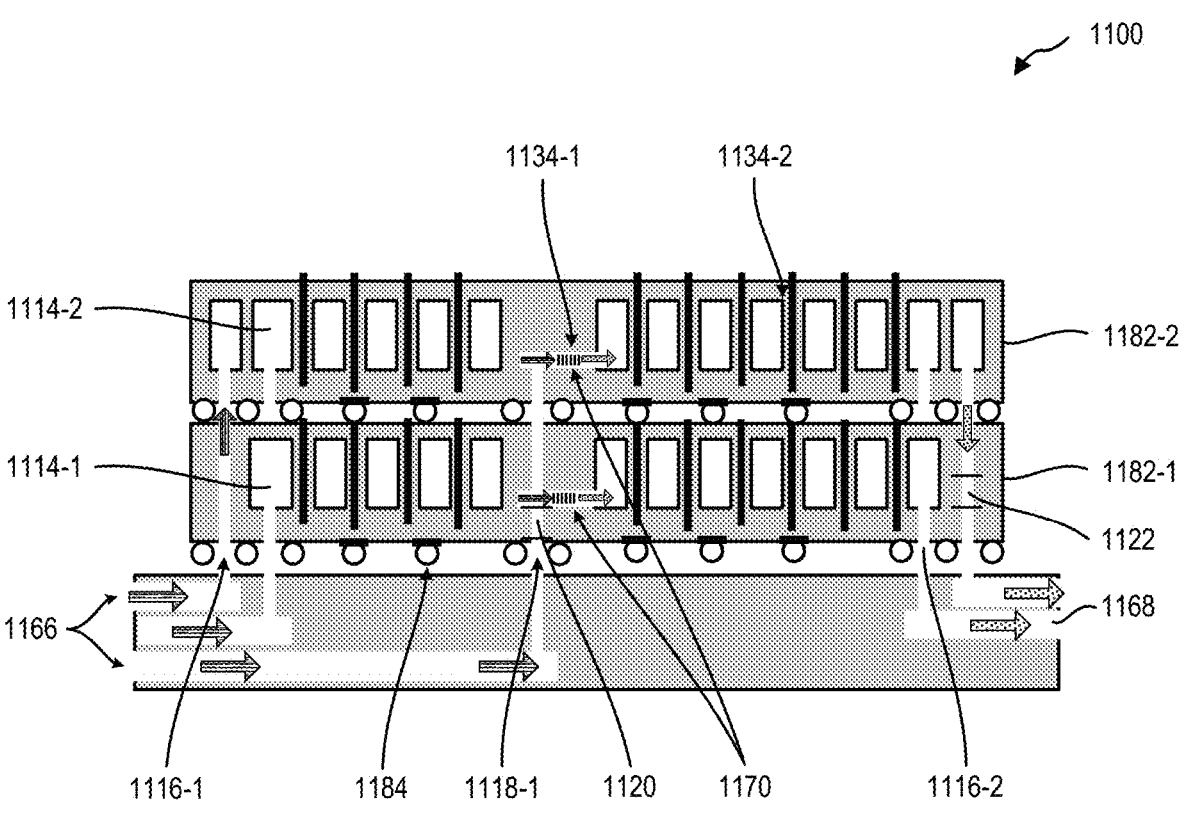
FIG. 11 is a side cross-sectional view of a stacked-die processor with microfluidic thermal management devices, according to at least some embodiments of the present disclosure.
Figure 12:
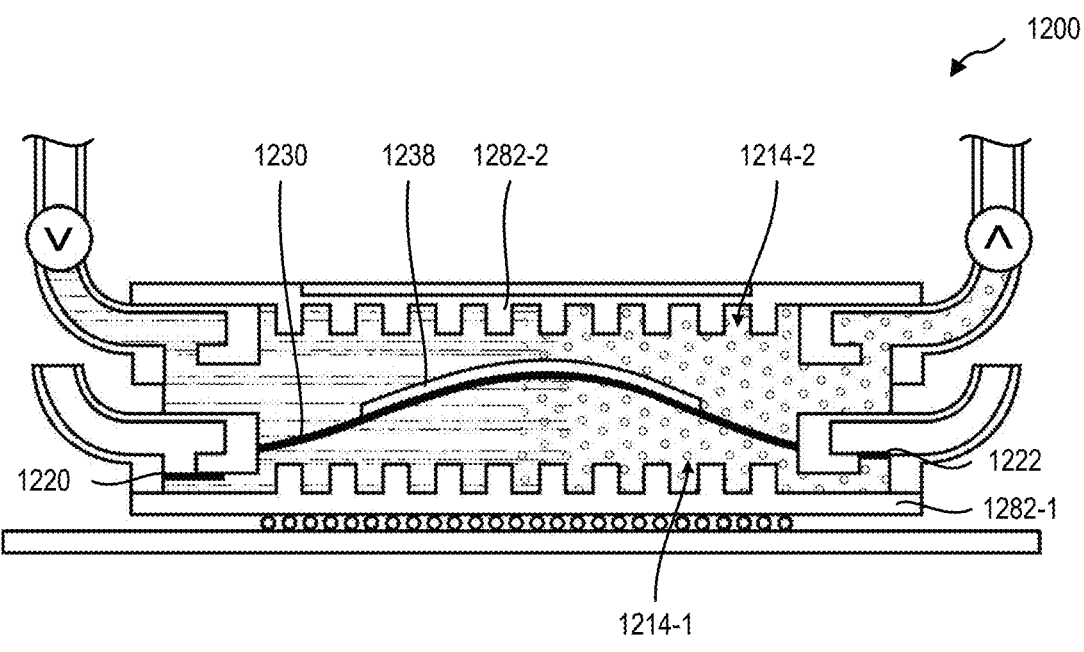
FIG. 12 is a side cross-sectional view of a stacked-die processor with a central microfluidic volume between dies, according to at least some embodiments of the present disclosure.

FIG. 11 and FIG. 12 are side cross-sectional views of embodiment of stacked die processors with a microfluidic volume position between a first die and a second die. FIG. 11 is a side cross-sectional view of an embodiment of a stacked-die processor 1100 with microfluidic thermal management device(s) according to the present disclosure. In some embodiments, the stacked-die processor 1100 includes a first die 1182-1 and a second die 1182-2 (e.g., substrates) that include a first microfluidic volume 1114-1 and a second microfluidic volume 1114-2, respectively. In some embodiments, the microfluidic volumes include sub-micron thermal elements 1134-1 and microscale thermal elements 1134-2. For example, the microscale thermal elements 1134-2 may include through silicon vias (TSVs) that allow electrical communication between the first die 1182-1 and the second die 1182-2 through electrical contacts 1184.

In some embodiments, the thermal management device(s) include a first port 1116-1 that provide an inlet to the first microfluidic volume 1114-1 and/or to the second microfluidic volume 1114-2. In some embodiments, an inlet to a microfluidic volume is positioned through another die. For example, an inlet valve 1120 may open a conduit through the first die 1182-1 to allow fluid communication into the second microfluidic volume 1114-2 of the second die 1182-2 to cool a hot spot 1170 of the second die 1182-2. In some embodiments, a second port 1116-2 includes an outlet valve 1122 of the thermal management device 1112 that allows working fluid to flow out of the second microfluidic volume 1114-2 is located in the first die 1182-1. It should be understood that ports 1116-1, 1116-2 proving fluid communication between the microfluidic volumes 1114-1, 1114-2 and inlet manifold 1166 or an outlet manifold 1168 may be located on or through any surface of the stacked die processor 1100.

FIG. 12 is a side cross-sectional view of an embodiment of a stacked-die processor 1200 with adjacent microfluidic volumes 1214-1, 1214-2 sharing a pumping membrane 1230. For example, the pumping membrane 1230 may divide a microfluidic volume between a first die 1282-1 and a second die 1282-2 into a first microfluidic volume 1214-1 and a second microfluidic volume 1214-2. The pumping membrane 1230 may be or include a pump piezoelectric element 1238 that, when an electrical voltage or current is applied thereto, moves and/or changes shape to alternately pump working fluid 1228 through the first microfluidic volume 1214-1 and the second microfluidic volume 1214-2. In some embodiments, inlet valves 1220 and/or outlet valves 1222 (and optionally, bi-directional manifolds) provide additional control over working fluid 1128 flow through the first microfluidic volume 1214-1 and the second microfluidic volume 1214-2.

Figure 13:
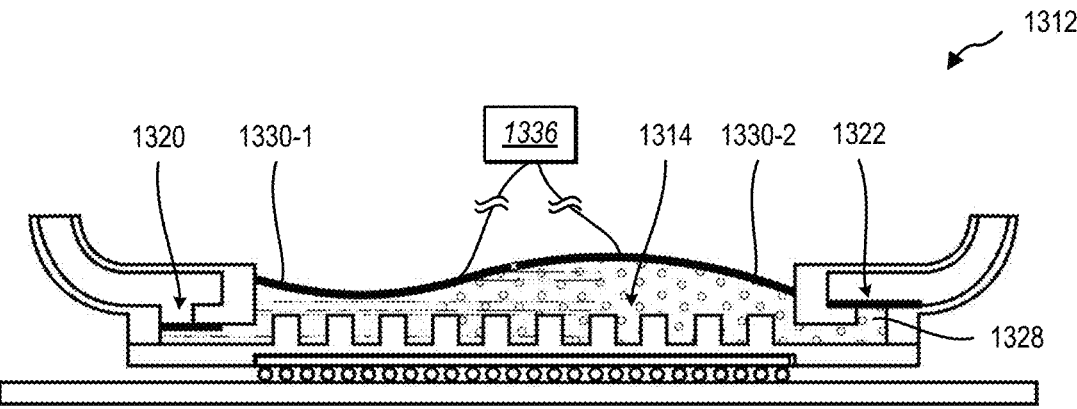
FIG. 13 is a side cross-sectional view of a thermal management device with a plurality of pumping membranes, according to at least some embodiments of the present disclosure.

While a single pumping membrane may pump a plurality of microfluidic volumes, multiple pumping membranes may pump a single microfluidic volume. FIG. 13 is a side cross-sectional view of a thermal management device 1312 with two pumping membranes 1330-1, 1330-2 contacting a microfluidic volume 1314. In some embodiments, a single power source 1336 provides electrical voltage or current to the first pumping membrane 1330-1 and the second pumping membrane 1330-2. In some embodiments, a different power source provides electrical voltage or current to the first pumping membrane 1330-1 and the second pumping membrane 1330-2. By alternating the application of electrical voltage or current to the pumping membranes 1330-1, 1330-2, a wave may be created in the microfluidic volume 1314 to more efficiently urge the working fluid 1328 from the inlet valve 1320 toward the outlet valve 1322 and to further control the flow rate, flow volume, flow path, or combinations thereof. In some embodiments, simultaneous application of electrical voltage or current replicates the pumping behavior of a single pumping membrane while limiting the overall displacement of the pumping membranes 1330-1, 1330-2 for applications with limited clearance available for the thermal management device 1312.

INDUSTRIAL APPLICABILITY

Conventional thermal management for processors, such as central processing units (CPUs) and graphical processing units (GPUs), memory, application specific integrated circuits (ASICs), system-on-chips (SOCs), system-in-packages (SIPs), and other heat-generating components in an electronic device seeks to conduct heat from the hottest portion (i.e., a hot spot) of the heat-generating component to colder regions. For example, a heat spreader may conduct heat from the hot spot(s) of a processor across a surface area of the processor and/or a thermal interface to a heat sink. In some examples, the thermal management moves heat from the hot spot(s) to an ambient air or to a liquid-cooling system.

A heat spreader may compensate for hot spots through a relatively high thermal capacity. Rapid changes in the temperature or the total dissipated power (TDP) in some regions of the heat-generating component are buffered by the high thermal capacity of the heat spreader. The heat spreader may then transfer the heat to the heat sink, which exhausts the waste heat. However, conventional heat spreaders and heat sinks require a relatively large volume and/or mass to effectively spread and exhaust heat. Microfluidic cooling allows a working fluid to be applied directly to the die or other surface of the heat-generating component. The lower mass and thermal capacity of a working fluid (liquid or gas) relative to a heat spreader can allow a hot spot to rise in temperature more than a conventional heat spreader.

In some embodiments according to the present disclosure, a working fluid is flowed through a microfluidic volume using selectively actuated valves and/or pumping membranes in the microfluidic volume to flow cool working fluid across hot spots and effectively manage the heat generated by the heat-generating components.

A thermal management device according to the present disclosure allows for working fluid to flow through a microfluidic volume in response to thermal management demands of the heat-generating component cooled by the thermal management device. While thermal management devices will be described herein in relation to processors, it should be understood that a microfluidic thermal management device according to various embodiments of the present disclosure may be equally applicable to other heat-generating components in an electronic device, and any description of a processor or elements of a processor should not be understood to limit such applications.

In some embodiments, a thermal management device includes a pumping membrane proximate to and/or in contact with the microfluidic volume. The pumping membrane may be or include a piezoelectric element that, when an electrical voltage or current is applied thereto, expands or contracts in at least one dimension and moves the pumping membrane. For example, the pumping membrane may include a piezoelectric material such that the pumping membrane moves and changes a volume of the microfluidic volume. In some examples, the volume increases when an electrical voltage or current is applied to the piezoelectric element. In some examples, the volume decreases when an electrical voltage or current is applied to the piezoelectric element. In at least one example, the pumping membrane is between a first microfluidic volume and a second microfluidic volume opposite the first microfluidic volume, such that movement of the pumping membrane causes a volume of the first microfluidic volume to increase while a volume of the second microfluidic volume decreases and vice versa.

In some embodiments, a thermal management device includes one or more valves positioned at ports to the microfluidic volume. The valves are selectively actuated to allow fluid communication to the microfluidic volume and flow of a working fluid through the microfluidic volume. In some embodiments, the valves include a flexible valve membrane that is movable between a closed position (e.g., seated against a valve seat) and an open position (e.g., at least partially moved away from the valve seat) to allow fluid flow therethrough. In some embodiments, the valve includes a rigid element that is movable between a closed position and an open position. By selectively allowing fluid communication through the ports, the valve(s) can adapt the flow of the working fluid, in flow rate, direction, or path, based at least partially on thermal management demands of the heat-generating component.

In at least some embodiments, a valve is actuatable by a piezoelectric element, such as a piezoelectric valve membrane or piezoelectric element in mechanical communication with a valve membrane. During application of an electric voltage or current to the piezoelectric element of the valve, the valve membrane may move between the closed position and open position or vice versa. In other examples, a piezoelectric element may move a rigid element of the valve between the closed position and open position or vice versa.

In some embodiments, a thermal management device according to the present disclosure is in electrical communication with a controller and/or power source that alters a flow of working fluid through the microfluidic volume at least partially based on the thermal management demands of the heat-generating component. In some examples, the thermal management demands are based at least partially on temperature measurements of one or more locations or portions of the heat-generating component, which may allow for additional cooling to those locations or portions in response to increases in temperature. In some examples, the thermal management demands are based at least partially on power draw measurements of one or more locations or portions of the heat-generating component, which may allow for additional cooling to be provided to those locations or portions in anticipation of temperature increases associated with power draw increases. In some examples, the thermal management demands are based at least partially on workload measurements or reports of one or more portions of the heat-generating component, which may allow for additional cooling to be provided to those locations or portions in anticipation of temperature increases associated with a change in workload. For example, the cooling capacity of the working fluid flowing through the microfluidic volume may lag, relative to the substantially step-function of the heat-generation of a processing core executing a newly assigned task and beginning to provide additional cooling capacity to that processing core upon assignment of the task may be beneficial.

In some embodiments, a processor includes a plurality of cores and a cache. In some cases, a process or workload assigned to the processor results in one region of the processor dissipating more heat than other regions of the processor. For example, a first core of the processor may generate more heat while under load than the cache, resulting a hot spot. In other examples, a second core may execute a task and generate more heat than the first core, resulting in a different hot spot. Under idle conditions, the processor may be substantially uniform in temperature and not exhibit hot spots.

The heat from the hot spot may be received by and/or transferred to a heat spreader. The heat spreader may be a solid heat spreader, such as a copper heat spreader that conducts the heat from the hot spot through the heat spreader. In other examples, the heat spreader may be a vapor chamber that contains a fluid therein to spread the heat across the heat spreader. In some examples, the heat spreader conducts the heat to a heat sink which then exhausts the heat. However, a conventional heat spreader and heat sink requires a substantial volume within an electronic device. For example, the clearance required for a heat spreader and heat sink may not be available in some electronic devices. Additionally, the thermal interfaces between the processor and the heat spreader, as well as between the heat spreader and the heat sink, may degrade over time and compromise the efficiency of the thermal management.

Microfluidic thermal management devices require smaller clearances and may have benefits cooling heat-generating components with high compute density and/or in smaller electronic devices. The microfluidic volume is in fluid communication with a first port and a second port. In some embodiments, the first port is an inlet and a second port is an outlet. In some embodiments, the first port is an inlet and a second port is an inlet, with a third port providing an outlet. In some embodiments, the first port is an outlet and a second port is an outlet, with a third port providing an inlet. As will be described herein, the first port and/or second port may be selectively changed between an inlet and an outlet.

In some embodiments, the ports are located with any relationship relative to one another and the microfluidic volume to provide fluid communication between the ports and the microfluidic volume.

In some embodiments, the first port and/or second port include a valve associated therewith to selectively allow fluid flow through the port. In some embodiments, a thermal management device with an inlet valve positioned at the first port and an outlet valve positioned at the second port. The inlet valve includes an inlet valve membrane that is movable between an open position and a closed position. In the open position, at least a portion of the inlet valve membrane is displaced from a seat of the inlet valve and allows fluid communication through the first port to the microfluidic volume. In the closed position, the inlet valve membrane seats against the seat of the inlet valve and limits and/or prevents fluid flow through the first port. In some embodiment, the outlet valve includes an outlet valve membrane that is movable between an open position and a closed position. In the open position, at least a portion of the outlet valve membrane is displaced from a seat of the outlet valve and allows fluid communication through the second port to the microfluidic volume. In the closed position, the outlet valve membrane seats against the seat of the outlet valve and limits and/or prevents fluid flow through the second port.

In some embodiments, a piezoelectric element is positioned in mechanical communication with the inlet valve membrane to selectively move at least a portion of the inlet valve membrane between the open position and the closed position when an electric voltage or current is applied to the piezoelectric element. For example, the inlet valve membrane is or includes the piezoelectric element, such that application of the electric voltage or current causes the inlet valve membrane to change shape and move between the open position and the closed position. In some embodiments, a piezoelectric element is positioned in mechanical communication with the outlet valve membrane to selectively move at least a portion of the outlet valve membrane between the open position and the closed position when an electric voltage or current is applied to the piezoelectric element. For example, the outlet valve membrane is or includes the piezoelectric element, such that application of the electric voltage or current causes the outlet valve membrane to change shape and move between the open position and the closed position.

In some embodiments, a power source is electrically coupled to the piezoelectric element (e.g., inlet valve membrane) of the inlet valve to selectively move the inlet valve to an open position. In some embodiments, the outlet valve is in a closed position while the inlet valve is in the open position, allowing flow of working fluid through the first port into the microfluidic volume upon movement of a pumping membrane.

Upon expanding the volume of the microfluidic volume, the movement of the pumping membrane generates a negative pressure in the microfluidic volume, which draws working fluid into the microfluidic volume past the inlet valve in the open position.

The pumping membrane is in mechanical communication with a piezoelectric element. The pumping membrane may be or include a piezoelectric element that, when an electrical voltage or current is applied thereto, expands or contracts in at least one dimension and moves at least a portion of the pumping membrane. For example, the pumping membrane may include a piezoelectric material such that the pumping membrane moves and changes a volume of the microfluidic volume. In some examples, the volume increases when an electrical voltage or current is applied to the piezoelectric element. In some examples, the volume decreases when an electrical voltage or current is applied to the piezoelectric element.

Upon expansion of the microfluidic volume, working fluid is drawn into the microfluidic volume. In some embodiments, the working fluid is a single-phase working fluid. For example, a single-phase working fluid is a working fluid that remains in a single physical phase or state throughout the flow through the microfluidic volume. In some embodiments, a single-phase working fluid has a boiling temperature at least 1° C. greater than an operating temperature of a heat-generating component cooled by the thermal management device. In some embodiments, a single-phase working fluid has a boiling temperature at least 5° C. greater than an operating temperature of a heat-generating component cooled by the thermal management device. In some embodiments, a single-phase working fluid has a boiling temperature at least 10° C. greater than an operating temperature of a heat-generating component cooled by the thermal management device. The working fluid receives heat generated by the heat-generating component and, upon expulsion from the microfluidic volume, transfers the heat from the microfluidic volume, cooling the heat-generating component.

In some embodiments, the working fluid is a two-phase working fluid. For example, a two-phase working fluid is a working fluid that changes physical phase or state throughout the flow through the microfluidic volume. In some embodiments, the two-phase working fluid changes from a liquid phase to a gaseous phase (e.g., vaporizes) after receiving heat from the heat-generating component while in the microfluidic volume. The change of phase from liquid phase to a gaseous phase allows the working fluid to absorb heat without a substantial increase in temperature of the working fluid. The heat absorbed overcomes the latent heat of boiling to vaporize the working fluid without increasing the temperature of the working fluid, thereby allowing the working fluid to absorb heat without an associated increase in temperature within the microfluidic volume.

The thermal management device includes thermal elements that increase surface area and/or contact area between the working fluid and the heat-generating component or thermal interface therebetween. In some embodiments, one or more thermal elements are integrally formed with or from the heat-generating components. In at least one example, the one or more thermal elements are integrally formed with or from a crystal or substrate (e.g., a die) of an integrated circuit or other heat-generating components. In such examples, the working fluid may provide on-die cooling and receive heat directly from the heat source, limiting or eliminating thermal interfaces that impair thermal conductivity away from the heat source.

In some embodiments, the thermal elements include fins, grooves, ridges, pins, tubes, rods, cones, hoops, pipes, or other structures that increase the surface area between the substrate or other heat source and the working fluid. In at least one example, the thermal element further includes a boiling enhancement coating or surface feature that promotes boiling of a two-phase working fluid. For example, the boiling enhancement coating or surface feature may increase a temperature range over which the two-phase working fluid exhibits nucleate boiling, increasing a temperature range over which the two-phase working fluid most efficiently absorbs heat from the thermal element.

The thermal management device then expels the working fluid from the microfluidic volume. In some embodiments, a power source is electrically coupled to the piezoelectric element (e.g., outlet valve membrane) of the outlet valve to selectively move the outlet valve to an open position. In some embodiment, the piezoelectric element opens the outlet valve upon application of the electric voltage or current to the piezoelectric element.

To ensure the working fluid does not flow back through the inlet valve, the inlet valve is moved to a closed position, such as by removing an electrical voltage or current from a piezoelectric element of the inlet valve. In some examples, the inlet valve membrane restores to the closed position elastically upon removal of the electrical voltage or current. In other examples, the electrical voltage or current applied to the piezoelectric element is inverted, moving the inlet valve membrane to the closed position.

In some embodiments, the pumping membrane moves or changes shape to decrease the volume of the microfluidic volume. Decreasing the volume of the microfluidic volume generates a positive pressure therein. While the inlet valve is in a closed position, the positive pressure results in at least a portion of the working fluid flowing past the thermal elements of the thermal management device and out the outlet valve. The working fluid carries heat out of the thermal management device.

In some embodiments, the pumping membrane decreases the volume of the microfluidic volume upon removal of the electrical voltage or current applied thereto. For example, the pumping membrane restores to the original position elastically upon removal of the electrical voltage or current from the piezoelectric element. In other examples, the electrical voltage or current applied to the piezoelectric element of the pumping membrane is inverted, moving the pumping membrane to decrease the volume of the microfluidic volume.

While actively controlled valves (e.g., containing or having piezoelectric elements associated therewith) are described herein, other embodiments include one or more passive valves. In some embodiments, a thermal management device includes a pumping membrane that changes a volume of a microfluidic volume of the thermal management device. As the pumping membrane moves and/or changes shape, the changing volume of the microfluidic volume moves working fluid through one-way valves or check valves of the thermal management device.

In some embodiments, a power source is electrically coupled to a pumping piezoelectric element in mechanical communication with the pumping membrane. Because the pumping piezoelectric element is coupled to a surface of the pumping membrane, changes in a longitudinal dimension of the pumping piezoelectric element when an electrical voltage or current is applied by the power source causes an associated change in shape of the pumping membrane.

In a static state, with no change in the electrical voltage or current applied to the pumping piezoelectric element, there is no flow of the working fluid through the microfluidic volume and/or through the inlet valve or outlet valve. For example, a biasing force of the inlet valve or outlet valve may hold a membrane or other element of the inlet valve or outlet valve against a seat of the valve, holding the valve in a closed position.

In some embodiments, upon application of an electric voltage or current by the power source to the pumping piezoelectric element, the pumping piezoelectric element changes in at least one dimension, moving the pumping membrane to increase a volume of the microfluidic volume. The increase in volume of the microfluidic volume generates a negative pressure in the microfluidic volume. In some embodiments, the negative pressure is sufficient to overcome the biasing force of the inlet valve, moving the inlet valve to an open position and allowing fluid flow therethrough and into the microfluidic volume. The working fluid flows through the inlet valve until the pumping membrane stops moving or the negative pressure is decreased to allow the inlet valve to restore to a closed position.

In some embodiments, the pumping membrane moves to decrease a volume of the microfluidic volume and generate a positive pressure in the microfluidic volume. In some embodiments, the positive pressure applies a force to the inlet valve that seats the inlet valve, thereby limiting and/or preventing backflow of the working fluid through inlet valve, and a force to the outlet valve. The force applied to the outlet valve is sufficient to overcome a biasing force of the outlet valve and move the outlet valve toward an open position. The hot working fluid is thereby expelled from the microfluidic volume upon the pumping membrane moving toward the microfluidic volume.

In some embodiments, the pumping membrane moves or changes shape based at least partially on elastic restoration after the electrical voltage or current from the power source is removed from the pumping piezoelectric element. In some embodiments, the pumping piezoelectric element moves or changes shape based at least partially on elastic restoration after the electrical voltage or current from the power source is removed, urging the pumping membrane toward an original state. In some embodiments, the power source applies a second electrical voltage or current that is different from or the inverse of the first electrical voltage or current to the pumping piezoelectric element. Upon application of the second electrical voltage or current, the pumping piezoelectric element changes shape in at least one dimension, moving the pumping membrane to the original position. The working fluid flows through the outlet valve until the pumping membrane stops moving or the positive pressure is decreased to allow the outlet valve to restore to a closed position. In some embodiments, the cycle may then begin again.

While embodiments described herein may include a pumping membrane that is actuatable between different positions and/or shapes to urge working fluid through a microfluidic volume, in some embodiments, valves control working fluid flow through the microfluidic volume that is pressurized by an external pump. In some embodiments, a thermal management device is configured to control working fluid flow through a microfluidic volume using at least one selectively actuated piezoelectric valve. The selectively actuated piezoelectric valve controls fluid communication between a pump (or a source conduit in communication with the pump) and the microfluidic volume of the thermal management device.

In some embodiments, the pumping membrane is substantially rigid during the working fluid flow through the microfluidic volume. For example, and in contrast to some embodiments described herein, the microfluidic volume is partially bounded by a membrane or other surface opposite the thermal elements that is substantially rigid and does not move while working fluid flows through the microfluidic volume. In some embodiments, the pumping membrane is an elastic membrane that moves upon the introduction of additional working fluid into the microfluidic volume to accommodate the additional working fluid in the microfluidic volume. For example, the inlet valve may open to allow working fluid pressurized by the pump to enter the microfluidic volume. In some embodiments, the outlet valve remains closed, and the pumping membrane elastically deforms to increase the volume of the microfluidic volume. Upon closure of the inlet valve and opening the outlet valve, the elastic energy of the pumping membrane may then urge the working fluid out of the microfluidic volume through the open outlet valve. The sequential opening of the valves may create a passive pumping membrane that pumps working fluid from the microfluidic volume after the pump urges the working fluid into the microfluidic volume.

In some embodiments, a pump delivers working fluid to the microfluidic volume while the inlet valve is in an open position. The working fluid flows through the microfluidic volume and out of the microfluidic volume through the open outlet valve. In some embodiments, the inlet valve and the outlet valve are both actively actuatable by a power source or power sources. In other embodiments, at least one of the inlet valve and the outlet valve is a passive valve that opens when a sufficient fluid pressure is applied to the valve. In at least one example, the inlet valve is actuatable by application of an electrical voltage or current to a piezoelectric element, while the outlet valve is a passive valve that allows flow of working fluid out of the microfluidic volume while limiting and/or preventing flow of working fluid into the microfluidic volume. For example, a biasing force, such as an elastic restoring force, of the outlet valve may cause the outlet valve to seat when a net pressure from the microfluidic volume is not positive or below a positive threshold pressure. For example, upon closure of the inlet valve, flow of the working fluid stops into the microfluidic volume. Without a positive pressure from the microfluidic volume, the net pressure across the outlet valve is insufficient to move or hold the outlet valve in the open position, and the outlet valve closes.

In some embodiments, the active control of the valve(s) and/or the pumping membrane is determined based at least partially on a thermal management demand of the heat-generating component being cooled by the thermal management device. In some examples, the method of thermal management includes obtaining a thermal management demand of a heat-generating component in thermal communication with a microfluidic volume. In some embodiments, the thermal management demand includes a local region of the microfluidic volume for the thermal management demand. For example, the thermal management demand may vary based on different regions of the heat-generating components. In some embodiments, obtaining a thermal management demand of a heat-generating component includes measuring or receiving a temperature of at least a portion of the heat-generating component. Obtaining the thermal management demand may include obtaining a plurality of thermal management demands of the heat-generating component based at least partially on a plurality of temperatures associated with different local regions. In at least one example, a processor may have different cores, caches, or other components in different areas of the processor, and the local regions may correlate to the components. In at least another example, the heat-generating device may be considered in a grid of local regions (e.g., a 3×3 grid of 9 local regions) with different thermal management demands associated with each of the local regions. In some examples, a thermal management device according to the present disclosure may be in electrical communication with a controller and/or power source that measures a thermal management demand of the heat-generating component. In at least one example, a controller and/or power source may be in electrical communication with a thermocouple or other temperature sensor(s) of the heat-generating component, and the controller and/or power source may report the thermal management demands of the In some examples, the thermal management demands are based at least partially on temperature measurements of one or more local regions (e.g., different locations or portions) of the heat-generating component, which may allow for additional cooling to those local regions in response to increases in temperature. In some examples, the thermal management demands are based at least partially on power draw measurements of one or more local regions of the heat-generating component, which may allow for additional cooling to be provided to those local regions in anticipation of temperature increases associated with power draw increases. In some examples, the thermal management demands are based at least partially on workload measurements or reports of one or more portions of the heat-generating component, which may allow for additional cooling to be provided to those local regions in anticipation of temperature increases associated with a change in workload. For example, the cooling capacity of the working fluid flowing through the microfluidic volume may lag, relative to the substantially step-function of the heat-generation of a processing core executing a newly assigned task, and beginning to provide additional cooling capacity to that processing core upon assignment of the task may be beneficial.

In some embodiments, the method further includes determining, based at least partially on the thermal management demand, a target flow rate of working fluid through the microfluidic volume. In some embodiments, the controller or power source may determine a target flow rate of the working fluid based on a size of a port(s) of the thermal management device and the available flow rate of a pumping membrane positioned in the microfluidic volume.

The method further includes applying an electric voltage or current to a pump piezoelectric element in mechanical communication with the pumping membrane and moving at least a portion of the pumping membrane. For example, the pumping membrane may have a pump piezoelectric element coupled thereto, such that a contraction or expansion of the pump piezoelectric element in at least one dimension cause a movement of at least a portion of the pumping membrane. In some examples, the pumping membrane may be the pump piezoelectric element and the electric voltage or current is applied to the pumping membrane to cause the pumping membrane to move and/or change shape.

The movement of the pumping membrane may result in altering a volume of the microfluidic volume based at least partially on the target flow rate, and changes in volume may be associated with pressure changes. The method further includes flowing working fluid into the microfluidic volume through an inlet of the microfluidic volume. In some embodiments, the pressure differential across the inlet drives working fluid into the microfluidic volume. In some embodiments, an external pump pressurizes the working fluid to urge the working fluid into the microfluidic volume.

In some embodiments, a method includes measuring a thermal management demand of a heat-generating component in thermal communication with a microfluidic volume, as described herein. In some embodiments, the thermal management demand includes a local region of the microfluidic volume for the thermal management demand. The method further includes determining, based at least partially on the thermal management demand, a flow path of working fluid through the microfluidic volume.

In some embodiments, determining the flow path includes selecting one or more valves to selectively actuate to direct working fluid from an inlet and through the microfluidic volume to an outlet. For example, the method includes actuating at least one valve by applying an electric voltage or current to a valve piezoelectric element in mechanical communication with a portion of an inlet valve. In some embodiments, the valve piezoelectric element moves or changes shape in response to the applied electric voltage or current, and the method includes moving at least a portion of the inlet valve. After opening the inlet valve, the method includes opening an outlet valve by applying an electric voltage or current to a valve piezoelectric element in mechanical communication with a portion of an outlet valve.

Based at least partially on the location and actuation timing of the inlet valve and the outlet valve, the method includes flowing working fluid in the flow path through the microfluidic volume from the inlet valve toward the outlet valve.

It should be understood that the methods described herein may be used in concert with one another to control both the flow rate and the flow path of the working fluid, or the methods described may be used independently of one another. For example, the embodiment of the method described to control the pumping membrane in the microfluidic volume of the thermal management device, and the method described to control the valves of the thermal management device to provide a target flow rate and flow path through the microfluidic volume and provide adaptive cooling to the heat-generating component may be used together or independently. In some embodiments, a method of thermal management includes at least some or all portions of the methods described herein.

By selectively actuating valves in an array of valves and/or ports of the thermal management device, the thermal management device can change the flow path of the working fluid to direct cool or fresh working fluid at the hottest regions of the heat generating component. In some embodiments, a thermal management device includes a plurality of inlets and a plurality of outlets. The inlets and outlets provide fluid communication to the microfluidic volume therebetween. In some embodiments, the inlets provide fluid communication between an inlet manifold and the microfluidic volume. For example, the array of inlets can selectively allow the cool working fluid from the inlet manifold into the microfluidic volume based at least partially on which of the inlets is actuated and moved to an open position. In some embodiments, the outlets provide fluid communication between the microfluidic volume and an outlet manifold. For example, after the working fluid receives heat from the heat generating component proximate the microfluidic volume, the array of outlets can selectively allow the hot working fluid out from the microfluidic volume into the outlet manifold based at least partially on which of the outlets is actuated and moved to an open position.

In some embodiments, the thermal management device is coupled to a substrate of the heat-generating component. In some embodiments, the thermal management device is supported by another component of the electronic device or computing device and contacts the heat-generating component.

Such as described in some embodiment of thermal management methods described herein, a controller or the thermal management device may measure a temperature, power draw, workload, or expected workload of one or more portions of the heat-generating component. In some embodiments, a hot spot is located in the center of the microfluidic volume. In other embodiments, the hot spot(s) are located elsewhere relative to the microfluidic volume.

In some embodiments, the thermal management device or controller/power source in electrical communication with the valves selectively actuates at least one inlet valve based at least partially on the location of the hot spot. In some embodiments, the thermal management device or controller/power source in electrical communication with the valves selectively actuates at least one outlet valve based at least partially on the location of the hot spot. In some embodiments, the thermal management device or controller/power source in electrical communication with the valves selectively actuates at least one inlet valve and at least one outlet valve based at least partially on the location of the hot spot.

In some embodiments, more or less valves are opened to change the flow volume, flow path, flow rate, or combinations thereof through the microfluidic volume. For example, opening all valves may increase the flow volume of working fluid. In some examples, opening less valves than all valves may increase the flow rate of working fluid, such as when a fluid pressure of the inlet manifold and/or outlet manifold is constant.

In some embodiments, a thermal management device includes a bi-directional manifold. For example, a thermal management device may include a bi-directional manifold at each of a first port and a second port. In some embodiments, a bi-directional manifold allows a port to selectively function as an inlet or an outlet. For example, the bi-directional manifold includes a movable element therein that opens or closes fluid communication with the inlet manifold and the outlet manifold. For example, in a first position, the movable element seats against an opening to the outlet manifold and opens an opening to the inlet manifold, allowing fluid communication between the inlet manifold and the microfluidic volume. When the bi-directional manifold of the first port is in the first position, the first port functions as an inlet to the microfluidic volume. For example, in a second position, the movable element seats against an opening to the inlet manifold and opens an opening to the outlet manifold, allowing fluid communication between the outlet manifold and the microfluidic volume. When the bi-directional manifold of the second port is in the second position, the second port functions as an outlet from the microfluidic volume. In some embodiments, the movable element is or is in mechanical communication with a piezoelectric element that, when an electrical voltage or current is applied thereto, moves between the first position and the second position.

In some embodiments, a valve positioned proximate a port (e.g., between the port and the bi-directional manifold) further controls fluid flow of the working fluid through the microfluidic volume. While the bi-directional manifold selectively changes the manifold to which the microfluidic volume is connected, the valve proximate the port selectively allows flow fluid between the manifold and the microfluidic volume.

In some embodiments, the bi-directional manifolds connected to the ports of the thermal management device allow any ports to be bi-directional ports. In at least one embodiment, the first port and the second port are changed to be an inlet port and an outlet port, respectively, to direct flow of working fluid through the microfluidic volume to cool a hot spot.

In some embodiments, the microfluidic volume and/or the heat-generating component is mapped to a grid or other coordinate system to report a location of a hot spot. The grid allows a controller or power source to associate ports with different hot spot locations on the grid to determine which ports to open and in what position of the bi-directional manifold associated with the port, if relevant.

In some embodiments, the thermal management device is not connected to a manifold. In some embodiments, a microfluidic thermal management device is submerged in an immersion cooling system. The immersion cooling system allows the thermal management device to be immersed in the working fluid. In some embodiments, the immersion cooling system is a two-phase immersion cooling system and includes a condenser to condense a vapor phase of the working fluid into a liquid phase to allow the liquid working fluid to flow through the microfluidic volume. In some embodiments, the immersion cooling system is a single-phase immersion cooling system. It should be understood that any embodiment of a thermal management device described herein may be immersed in an immersion cooling system.

A microfluidic thermal management system according to some embodiments of the present disclosure may be used in a stacked-die processor or other three-dimensional computing component. In some embodiments, the stacked-die processor includes a first die and a second die (e.g., substrates)

that include a first microfluidic volume and a second microfluidic volume, respectively. In some embodiments, the microfluidic volumes include sub-micron thermal elements and/or microscale thermal elements. For example, the microscale thermal elements may include through silicon vias (TSVs) that allow electrical communication between the first die and the second die.

In some embodiments, the thermal management device(s) include a first port that provides an inlet to the first microfluidic volume and/or to the second microfluidic volume. In some embodiments, an inlet to a microfluidic volume is position through another die. For example, an inlet valve may open a conduit through the first die to allow fluid communication into the second microfluidic volume of the second die. In some embodiments, a second port includes an outlet valve of the thermal management device that allows working fluid to flow out of the second microfluidic volume is located in the first die. It should be understood that ports proving fluid communication between the microfluidic volumes and inlet manifold or an outlet manifold may be located on or through any surface of the stacked die processor.

In some embodiments, the pumping membrane divides a microfluidic volume between a first die and a second die into a first microfluidic volume and a second microfluidic volume. The pumping membrane may be or include a pump piezoelectric element that, when an electrical voltage or current is applied thereto, moves and/or changes shape to alternately pump working fluid through the first microfluidic volume and the second microfluidic volume. In some embodiments, inlet valves and/or outlet valves (and optionally, bi-directional manifolds) provide additional control over working fluid flow through the first microfluidic volume and the second microfluidic volume.

While a single pumping membrane may pump a plurality of microfluidic volumes, multiple pumping membranes may pump a single microfluidic volume. In some embodiments, a single power source provides electrical voltage or current to the first pumping membrane and the second pumping membrane. In some embodiments, a different power source provides electrical voltage or current to the first pumping membrane and the second pumping membrane. By alternating the application of electrical voltage or current to the pumping membranes, a wave may be created in the microfluidic volume to more efficiently urge the working fluid from the inlet valve toward the outlet valve and to further control the flow rate, flow volume, flow path, or combinations thereof. In some embodiments, simultaneous application of electrical voltage or current replicates the pumping behavior of a single pumping membrane while limiting the overall displacement of the pumping membranes for applications with limited clearance available for the thermal management device.

The present disclosure relates to systems and methods for microfluidic thermal management according to at least the examples provided in the sections below:

[A1] In some embodiments, a thermal management device includes a microfluidic volume having a first peripheral side and a second peripheral side and including at least one thermal element, a first port to the microfluidic volume, a second port from the microfluidic volume, an inlet valve at the first port to the microfluidic volume, an outlet valve at the second port, and a valve piezoelectric element in mechanical communication with a portion of at least one of the inlet valve and the outlet valve to move at least the portion of the at least one of the inlet valve and the outlet valve and selectively allow fluid flow through the microfluidic volume.

[A2] In some embodiments, the first port of [A1] is one port of a plurality of ports in fluid communication with an inlet manifold.

[A3] In some embodiments, the second port of [A1] is one port of a plurality of ports in fluid communication with an outlet manifold.

[A4] In some embodiments, the thermal management device of any of [A1] through [A3] includes an integrated circuit substrate, and the microfluidic volume is at least partially defined by the integrated circuit substrate.

[A5] In some embodiments, the thermal management device of any of [A1] through [A4] includes a pumping membrane located adjacent to the microfluidic volume between a first peripheral side and a second peripheral side.

[A6] In some embodiments, the pumping membrane of [A5] is or includes a pump piezoelectric element.

[A7] In some embodiments, the valve piezoelectric element of any of [A1] through [A6] is in mechanical communication with at least one of an inlet valve membrane of the inlet valve and an outlet valve membrane of the outlet valve to move at least a portion of the inlet valve membrane or the outlet valve membrane and selectively allow fluid flow through the microfluidic volume.

[A8] In some embodiments, the valve piezoelectric element of [A7] is in mechanical communication with at least a portion of the inlet valve, and the outlet valve is passive.

[A9] In some embodiments, the thermal management device of any of [A1] through [A8] includes an external pump to pressurize a working fluid proximate the inlet valve.

[B1] In some embodiments, a method of thermal management includes measuring a thermal management demand of a heat-generating component in thermal communication with a microfluidic volume; determining, based at least partially on the thermal management demand, a flow path of working fluid through the microfluidic volume; applying an electric voltage or current to a valve piezoelectric element in mechanical communication with a portion of an inlet valve; moving at least a portion of the inlet valve; applying an electric voltage or current to a valve piezoelectric element in mechanical communication with a portion of an outlet valve; moving at least a portion of the outlet valve; and flowing working fluid in the flow path through the microfluidic volume from the inlet valve toward the outlet valve.

[B2] In some embodiments, the thermal management demand of [B1] includes a temperature of the heat-generating component.

[B3] In some embodiments, the thermal management demand of [B1] includes a workload of the heat-generating component.

[B4] In some embodiments, the thermal management demand of [B1] includes a power draw of the heat-generating component.

[B5] In some embodiments, the thermal management demand of [B1] includes a local region of the heat-generating component.

[B6] In some embodiments, the method of any of [B1] through [B5] further includes selectively opening an inlet valve of the inlet based at least partially on the local region of the thermal management demand.

[B7] In some embodiments, opening the inlet valve of [B6] includes applying an electric voltage or current to a pump piezoelectric element in mechanical communication with a pumping membrane.

[C1] In some embodiments, a thermal management device includes a microfluidic volume having a first peripheral side and a second peripheral side and including at least one thermal element, a first port to the microfluidic volume, a second port the microfluidic volume, a first bi-directional manifold in fluid communication with the first port, and a second bi-directional manifold in fluid communication with the second port.

[C2] In some embodiments, the thermal management device of [C1] further includes a pump configured to pressurize a working fluid at an inlet manifold.

[C3] In some embodiments, the thermal management device of [C1] further includes a first valve between the first port and the first bi-directional manifold.

[C4] In some embodiments, the thermal management device of [C1] further includes a second valve between the first port and the first bi-directional manifold.

The articles "a," "an," and "the" are intended to mean that there are one or more of the elements in the preceding descriptions. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. For example, any element described in relation to an embodiment herein may be combinable with any element of any other embodiment described herein. Numbers, percentages, ratios, or other values stated herein are intended to include that value, and also other values that are "about" or "approximately" the stated value, as would be appreciated by one of ordinary skill in the art encompassed by embodiments of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the spirit and scope of the present disclosure, and that various changes, substitutions, and alterations may be made to embodiments disclosed herein without departing from the spirit and scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the embodiments that falls within the meaning and scope of the claims is to be embraced by the claims.

It should be understood that any directions or reference frames in the preceding description are merely relative directions or movements. For example, any references to "front" and "back" or "top" and "bottom" or "left" and "right" are merely descriptive of the relative position or movement of the related elements.

The present disclosure may be embodied in other specific forms without departing from its spirit or characteristics.

The described embodiments are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. A thermal management device comprising:
   a microfluidic volume having a first peripheral side and a second peripheral side and including at least one thermal element, wherein the microfluidic volume is at least partially defined by an integrated circuit substrate;
   a first port to the microfluidic volume;
   a second port from the microfluidic volume;
   an inlet valve at the first port to the microfluidic volume;
   an outlet valve at the second port; and
   a valve piezoelectric element in mechanical communication with a portion of at least one of the inlet valve and the outlet valve to move at least the portion of the at least one of the inlet valve and the outlet valve and selectively allow fluid flow through the microfluidic volume, wherein the thermal management device has a first state in which the inlet valve is open and the outlet valve is closed to allow the fluid flow into the microfluidic volume and a second state in which the inlet valve is closed and the outlet valve is open to allow the fluid flow out of the microfluidic volume.

2. The thermal management device of claim 1, wherein the first port is one port of a plurality of ports in fluid communication with an inlet manifold.

3. The thermal management device of claim 1, wherein the second port is one port of a plurality of ports in fluid communication with an outlet manifold.

4. The thermal management device of claim 1,
   wherein the at least one thermal element is integrally formed with the integrated circuit substrate.

5. The thermal management device of claim 1, further comprising a pumping membrane located adjacent to the microfluidic volume between the first peripheral side and the second peripheral side.

6. The thermal management device of claim 5, wherein the pumping membrane is or includes a pump piezoelectric element.

7. The thermal management device of claim 1, wherein the valve piezoelectric element is in mechanical communication with at least one of an inlet valve membrane of the inlet valve and an outlet valve membrane of the outlet valve to move at least a portion of the inlet valve membrane or the outlet valve membrane and selectively allow the fluid flow through the microfluidic volume.

8. The thermal management device of claim 7, wherein the valve piezoelectric element is in mechanical communication with at least a portion of the inlet valve, and the outlet valve is passive.

9. The thermal management device of claim 1, further comprising an external pump to pressurize a working fluid proximate the inlet valve.

10. A method of thermal management, the method comprising:
   measuring a thermal management demand of a heat-generating component in thermal communication with the thermal management device of claim 1 and in thermal communication with the microfluidic volume;
   determining, based at least partially on the thermal management demand, a flow path of a working fluid through the microfluidic volume;

applying a first electric voltage or current to the valve piezoelectric element in mechanical communication with the inlet valve;

moving the inlet valve;

applying a second electric voltage or current to a second valve piezoelectric element in mechanical communication with the outlet valve;

moving the outlet valve; and flowing the working fluid in the flow path through the microfluidic volume from the inlet valve toward the outlet valve.

11. The method of claim 10, wherein the thermal management demand includes a temperature of the heat-generating component.

12. The method of claim 10, wherein the thermal management demand includes a workload of the heat-generating component.

13. The method of claim 10, wherein the thermal management demand includes a power draw of the heat-generating component.

14. The method of claim 10, wherein the thermal management demand includes a local region of the heat-generating component.

15. The method of claim 14, further comprising selectively opening the inlet valve based at least partially on the local region of the thermal management demand.

16. The method of claim 15, wherein opening the inlet valve includes applying an electric voltage or current to a pump piezoelectric element in mechanical communication with a pumping membrane.

17. A thermal management system comprising:

a first bi-directional manifold in fluid communication with the thermal management device of claim 1, wherein the first bi-directional manifold is in fluid communication with the first port and the inlet valve; and a second bi-directional manifold in fluid communication with the thermal management device of claim 1, wherein the second bi-directional manifold is in fluid communication with the second port and the outlet valve.

18. The thermal management system of claim 17, further comprising a pump configured to pressurize a working fluid at an inlet manifold.

19. The thermal management system of claim 17, wherein the first inlet valve is between the first port and the first bi-directional manifold.

20. The thermal management system of claim 19, wherein the outlet valve is between the second port and the second bi-directional manifold.

* * * * *